United States Patent
Dunga et al.

(10) Patent No.: US 8,877,627 B2
(45) Date of Patent: Nov. 4, 2014

(54) METHOD OF FORMING PN FLOATING GATE NON-VOLATILE STORAGE ELEMENTS AND TRANSISTOR HAVING N+ GATE

(71) Applicant: SanDisk Technologies Inc., Plano, TX (US)

(72) Inventors: Mohan Dunga, Santa Clara, CA (US); Sanghyun Lee, Davis, CA (US); Masaaki Higashitani, Cupertino, CA (US); Tuan Pham, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/106,281

(22) Filed: Dec. 13, 2013

(65) Prior Publication Data
US 2014/0106525 A1 Apr. 17, 2014

Related U.S. Application Data

(62) Division of application No. 13/072,130, filed on Mar. 25, 2011, now abandoned.

(60) Provisional application No. 61/450,528, filed on Mar. 8, 2011.

(51) Int. Cl.
| | |
|---|---|
| *H01L 21/4763* | (2006.01) |
| *G11C 16/34* | (2006.01) |
| *H01L 29/788* | (2006.01) |
| *G11C 11/56* | (2006.01) |
| *H01L 27/115* | (2006.01) |
| *H01L 29/66* | (2006.01) |
| *G11C 16/04* | (2006.01) |
| *H01L 21/28* | (2006.01) |

(52) U.S. Cl.
CPC ...... *H01L 29/66825* (2013.01); *G11C 16/3418* (2013.01); *H01L 29/7881* (2013.01); *G11C 11/5642* (2013.01); *H01L 27/11521* (2013.01); *G11C 16/0408* (2013.01); *H01L 27/11529* (2013.01); *H01L 27/11524* (2013.01); *H01L 21/28273* (2013.01)
USPC .................. 438/593; 257/315; 257/E21.158; 257/E29.3; 438/264

(58) Field of Classification Search
USPC ........ 257/315, E21.158, E29.3; 438/593, 264
See application file for complete search history.

(56) References Cited

U.S. PATENT DOCUMENTS

| | | | |
|---|---|---|---|
| 5,604,357 | A | 2/1997 | Hori |
| 5,717,237 | A | 2/1998 | Chi |

(Continued)

FOREIGN PATENT DOCUMENTS

EP 2068351 A1 6/2009

OTHER PUBLICATIONS

Office Action dated Feb. 15, 2013, U.S. Appl. No. 13/072,130, filed Mar. 25, 2011, 24 pages.

(Continued)

*Primary Examiner* — Elias M Ullah
(74) *Attorney, Agent, or Firm* — Vierra Magen Marcus LLP

(57) ABSTRACT

Non-volatile storage elements having a PN floating gate are disclosed herein. The floating gate may have a P– region near the tunnel oxide, and may have an N+ region near the control gate. In some embodiments, a P– region near the tunnel oxide helps provide good data retention. In some embodiments, an N+ region near the control gate helps to achieve a good coupling ratio between the control gate and floating gate. Therefore, programming of non-volatile storage elements is efficient. Also erasing the non-volatile storage elements may be efficient. In some embodiments, having a P– region near the tunnel oxide (as opposed to a strongly doped p-type semiconductor) may improve erase efficiency relative to P+.

20 Claims, 30 Drawing Sheets

(56) References Cited

U.S. PATENT DOCUMENTS

| | | | |
|---|---|---|---|
| 5,753,952 A | 5/1998 | Mehrad | |
| 6,630,383 B1 | 10/2003 | Ibok et al. | |
| 6,790,729 B1 | 9/2004 | Woo | |
| 8,503,229 B2 | 8/2013 | Lee et al. | |
| 2005/0079671 A1 | 4/2005 | Chen et al. | |
| 2006/0237768 A1 | 10/2006 | Forbes et al. | |
| 2006/0278917 A1 | 12/2006 | Forbes et al. | |
| 2007/0082495 A1 | 4/2007 | Matthew et al. | |
| 2007/0132004 A1 | 6/2007 | Yasuda et al. | |
| 2007/0145462 A1 | 6/2007 | Eldridge et al. | |
| 2009/0140313 A1 | 6/2009 | Joo | |
| 2009/0283817 A1 | 11/2009 | Krishnamohan et al. | |
| 2012/0228691 A1 | 9/2012 | Dunga et al. | |

OTHER PUBLICATIONS

Response to Office Action dated May 10, 2013, U.S. Appl. No. 13/072,130, filed Mar. 25, 2011, 9 pages.

Final Office Action dated Sep. 6, 2013, U.S. Appl. No. 13/072,130, filed Mar. 25, 2011, 10 pages.

Notice of Allowance and Fee(s) Due dated Dec. 12, 2012, U.S. Appl. No. 13/153,964, filed Jun. 6, 2011, 21 pages.

Notice of Allowance and Fee(s) Due dated Apr. 3, 2013, U.S. Appl. No. 13/153,964, filed Jun. 6, 2011, 10 pages.

Supplemental Notice of Allowance and Fee(s) Due dated Jun. 10, 2013, U.S. Appl. No. 13/153,964, filed Jun. 6, 2011, 11 pages.

International Search Report and Written Opinion of the International Searching Authority dated May 31, 2012, PCT Application No. PCT/US2012/027920 filed Mar. 6, 2012, 13 pages.

Partial International Search Report and Written Opinion of the International Searching Authority dated Jun. 27, 2012, PCT Application No. PCT/US2012/029133, filed Mar. 14, 2012, 2 pages.

International Search Report and Written Opinion of the International Searching Authority dated Aug. 8, 2012, PCT Application No. PCT/US2012/029133, filed Mar. 14, 2012, 18 pages.

Chung, Steve S., et al., "A Novel High Performance and Reliability p-Type Floating Gate N-Channel Flash EEPROM," 1999 Symposium on VLSI Technology Digest of Technical Papers, Jun. 1999, pp. 19-20, Kyoto, Japan.

Chen, Shen, et al., "P-Type Floating Gate for Retention and P/E Window Improvement of Flash Memory Devices," IEEE Transactions on Electron Devices, Aug. 2007, pp. 1910-1917, vol. 54, No. 8, IEEE Electron Devices Society.

Blomme, Pieter, et al., "Novel Dual Layer Floating Gate Structure as Enabler of Fully Planar Flash Memory," 2010 Symposium on VLSI Technology Digest of Technical Papers, Jun. 2010, pp. 129-130, Honolulu, Hawaii, USA.

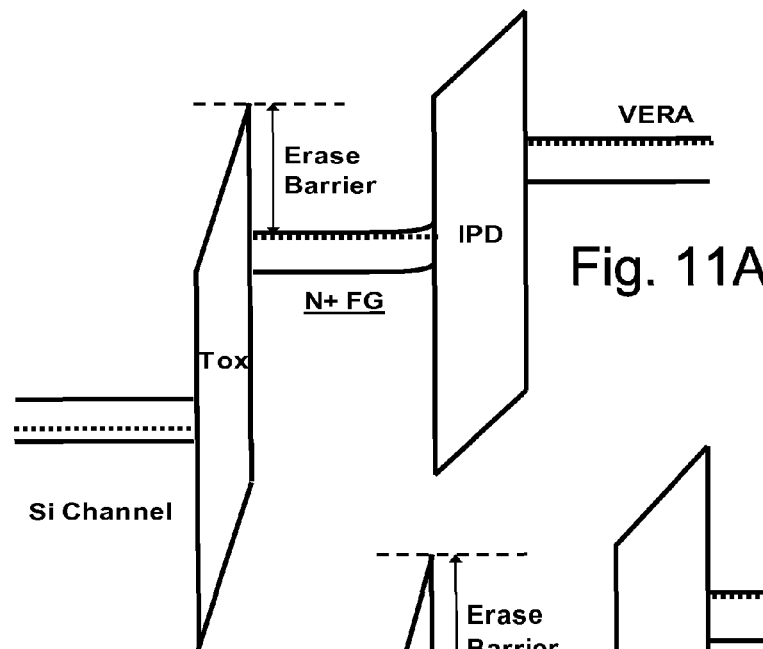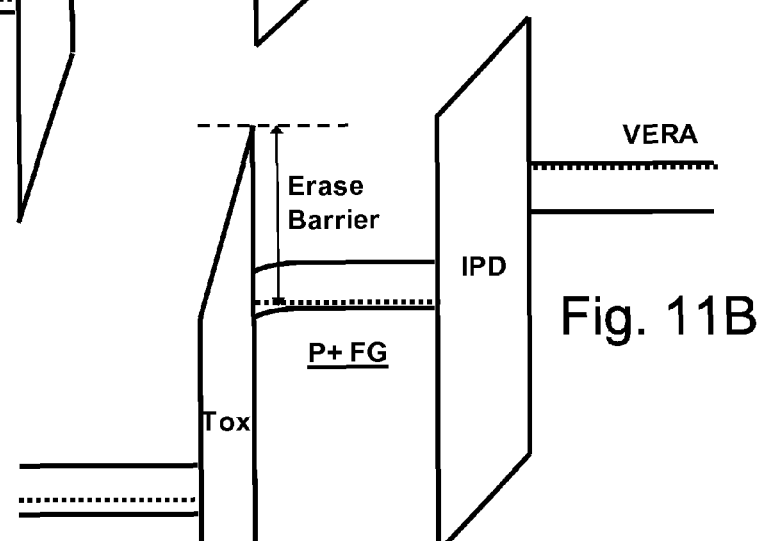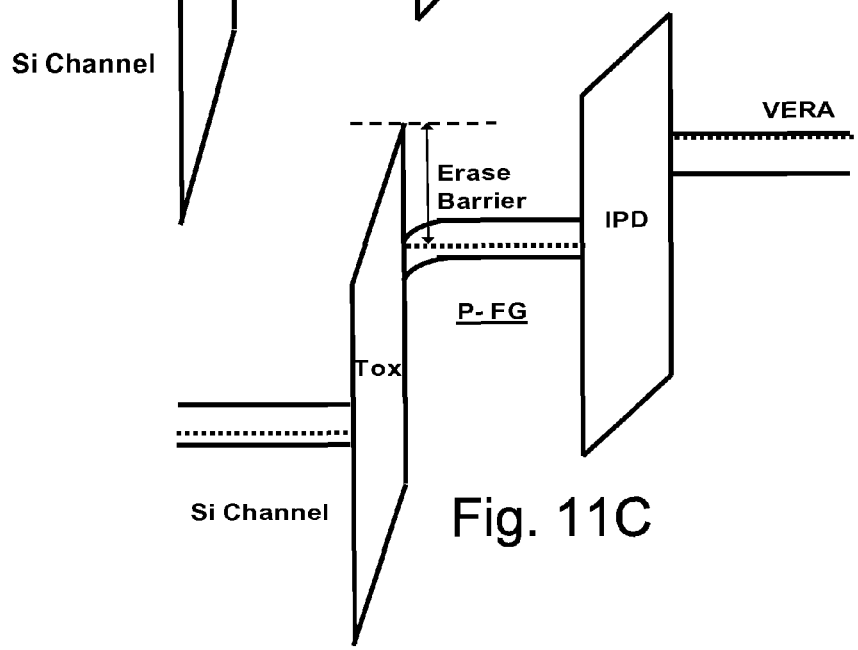

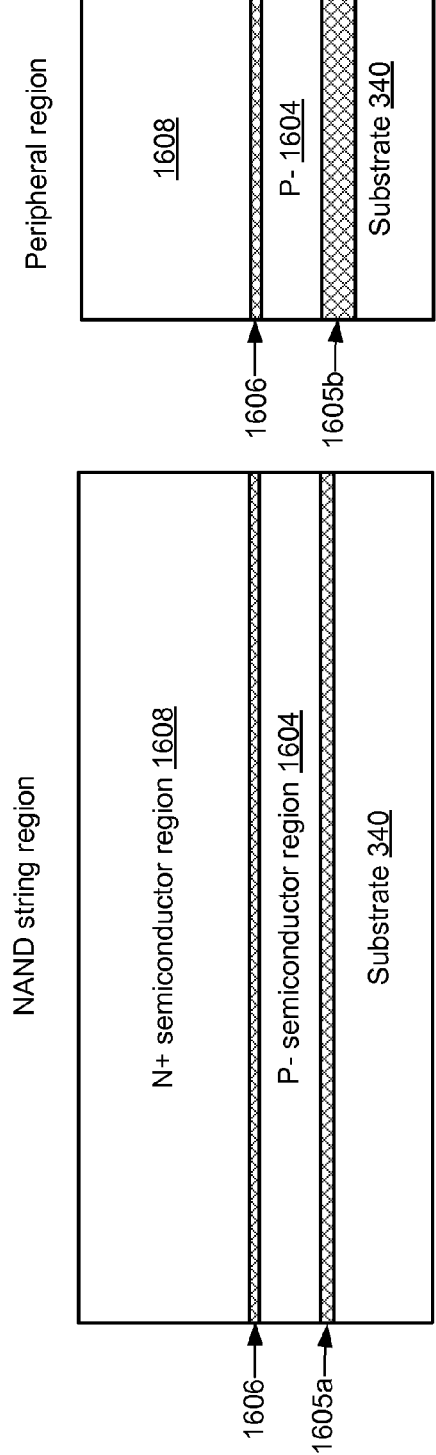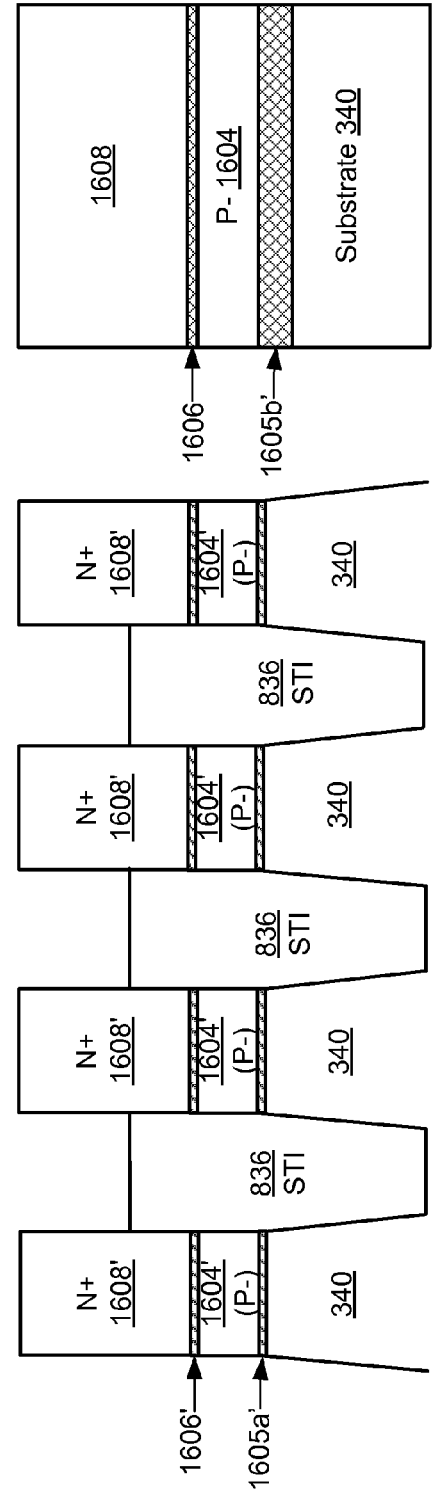

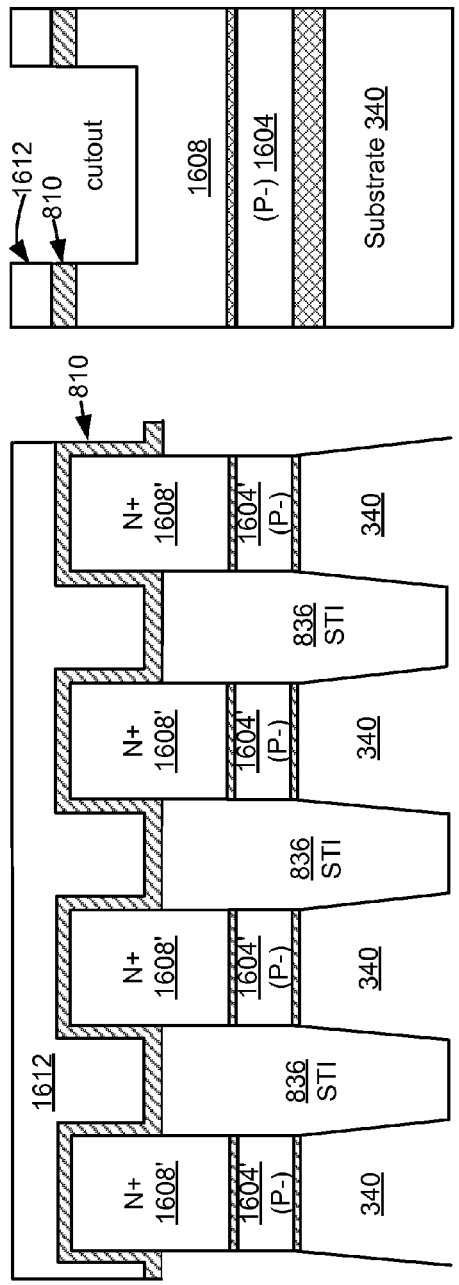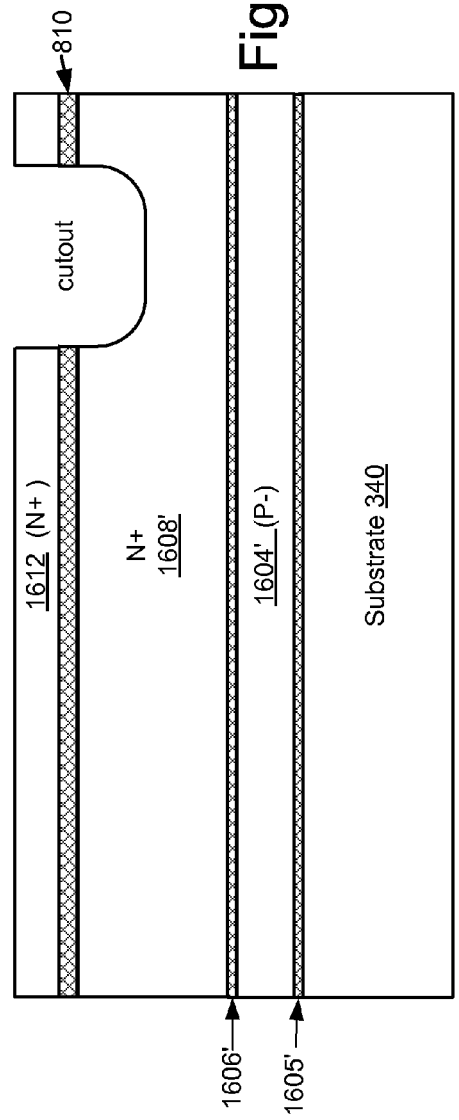

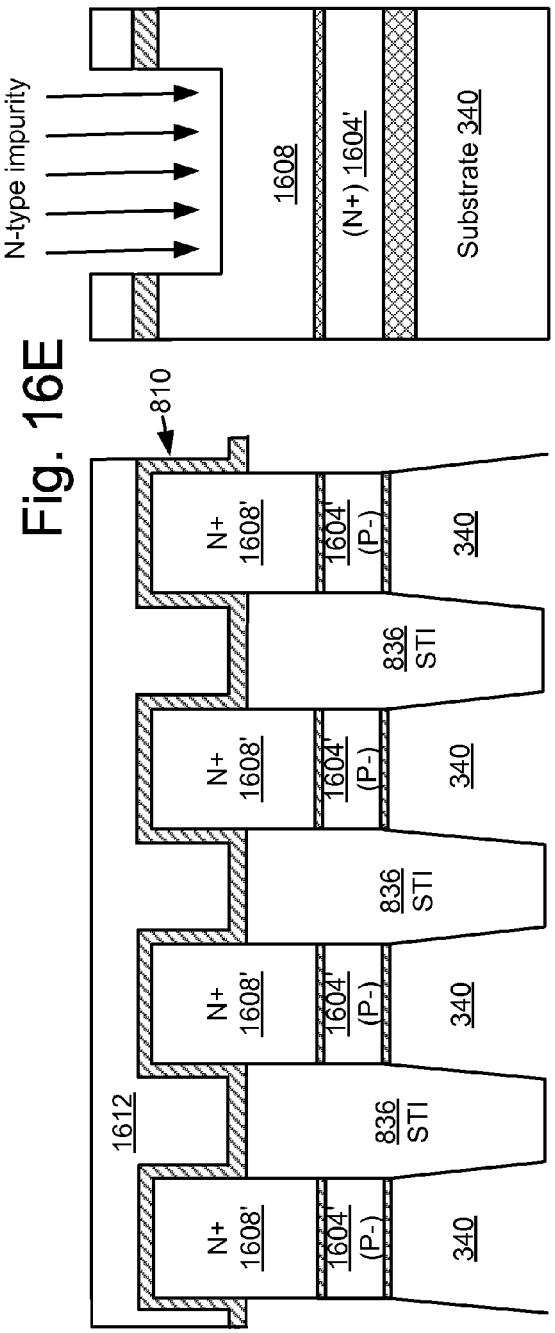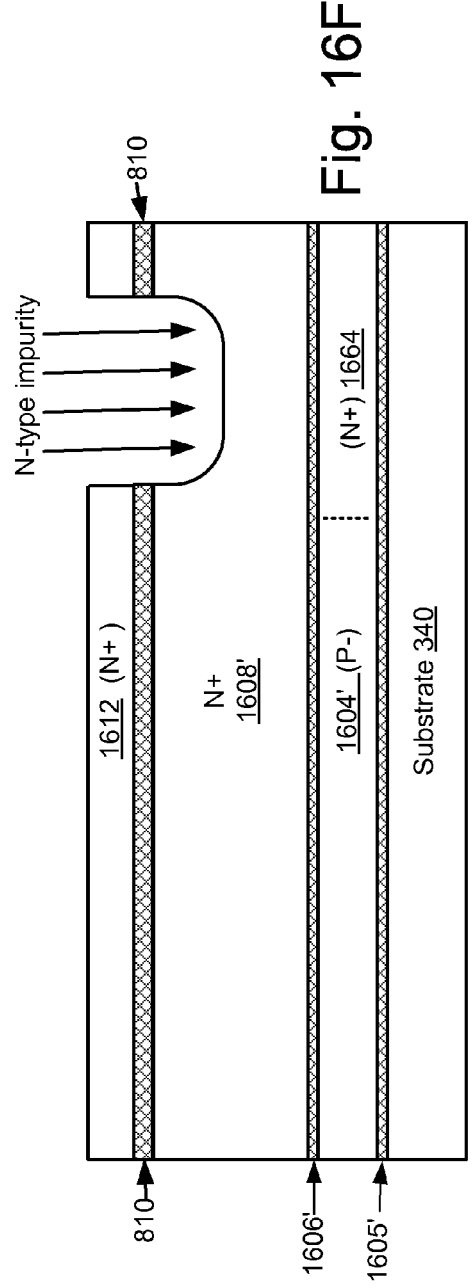

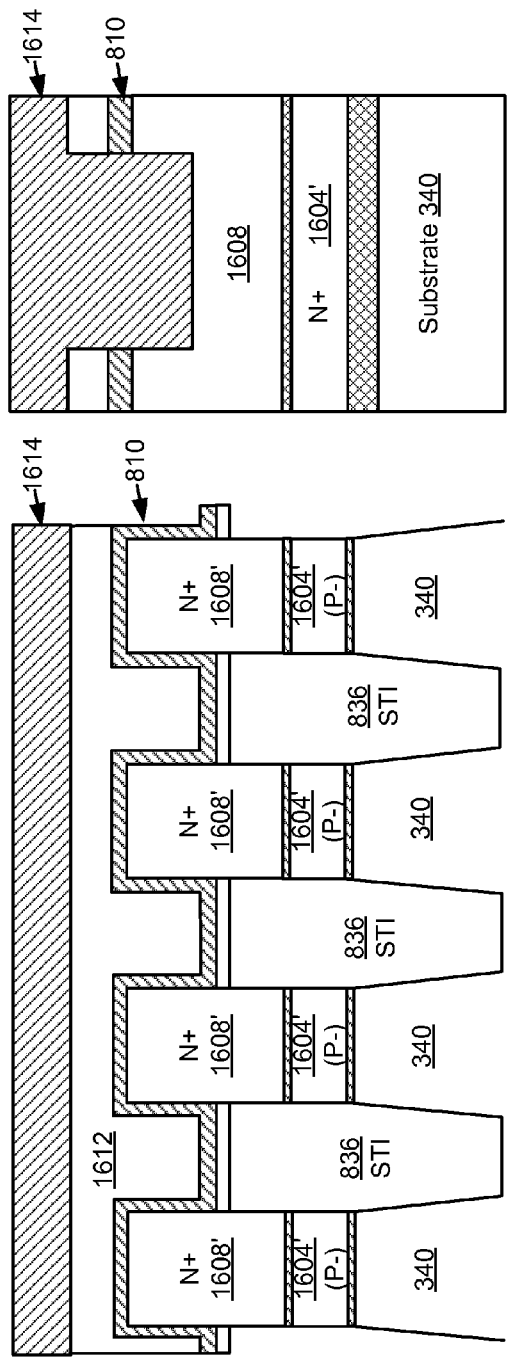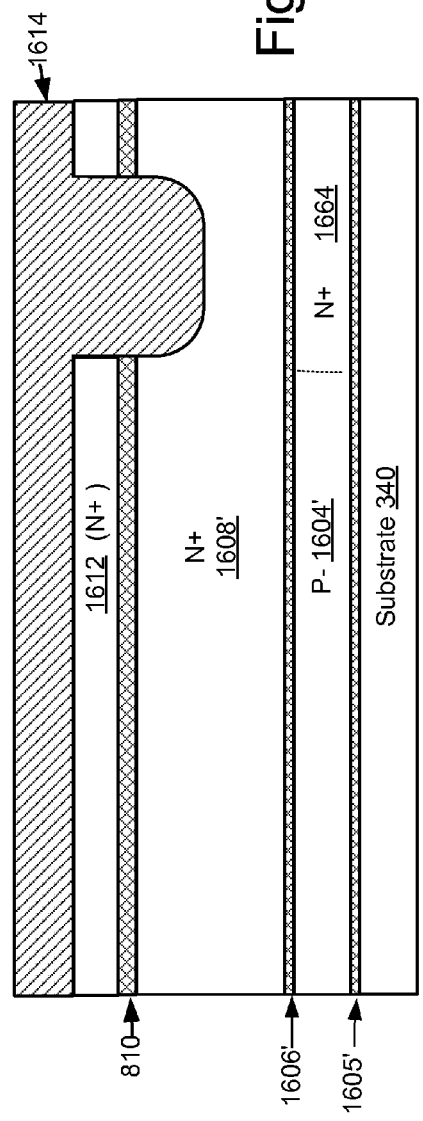

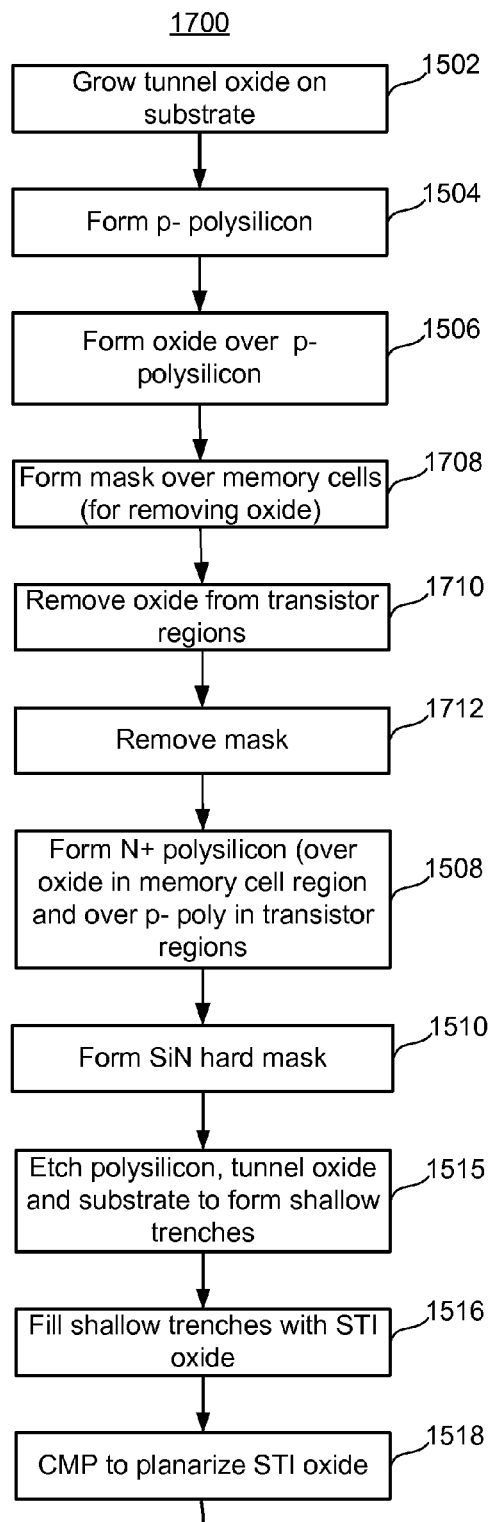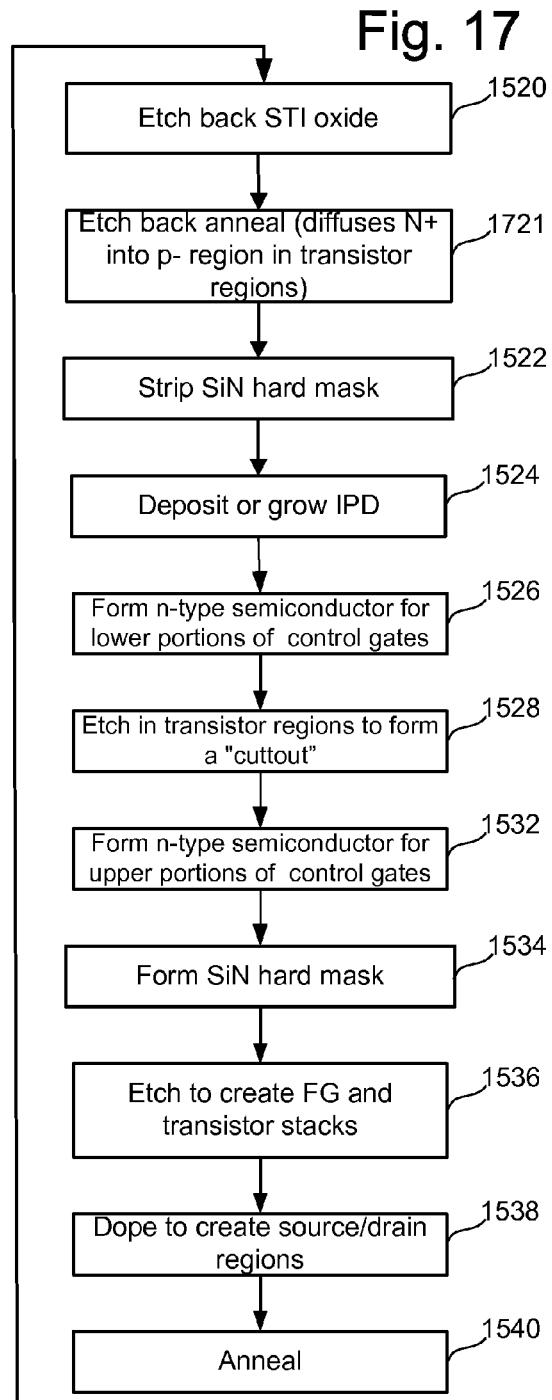
Fig. 17

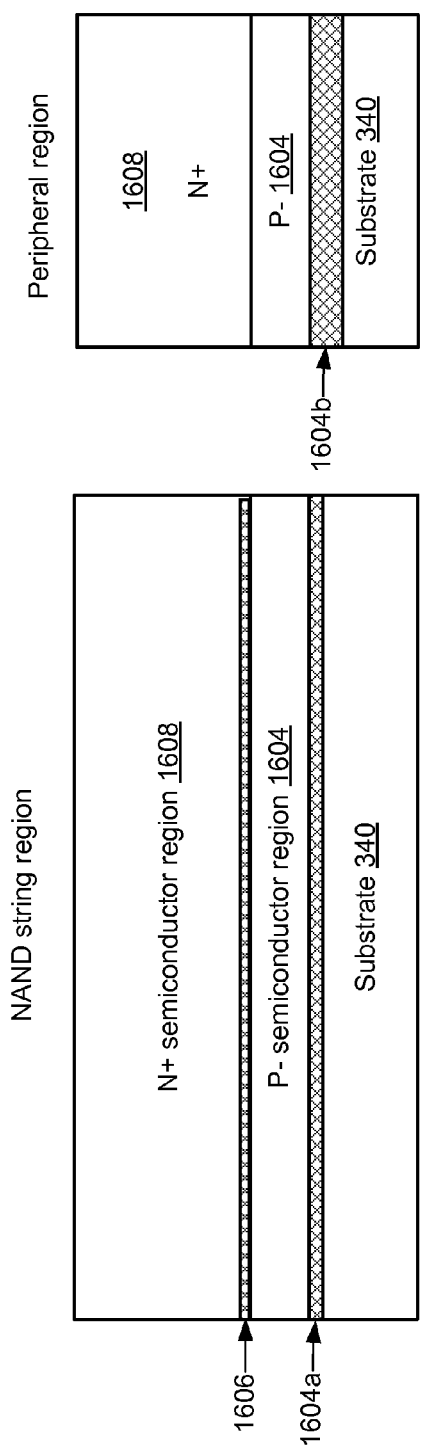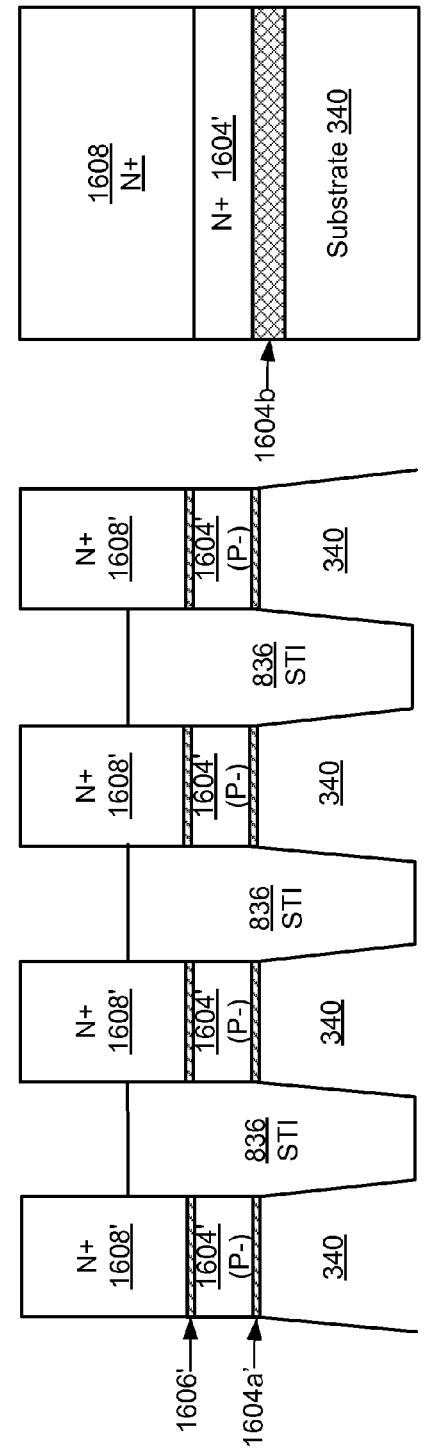

METHOD OF FORMING PN FLOATING GATE NON-VOLATILE STORAGE ELEMENTS AND TRANSISTOR HAVING N+ GATE

PRIORITY

This application is a divisional application of U.S. patent application Ser. No. 13/072,130, entitled "PN Floating Gate Non-Volatile Storage Element," by Dunga et al., filed on Mar. 25, 2011, which claims the benefit of U.S. Provisional Application No. 61/450,528, entitled "PN Floating Gate Non-Volatile Storage Element," by Dunga et al., filed on Mar. 8, 2011, incorporated herein by reference.

BACKGROUND

1. Field

This disclosure relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both traditional EEPROM and flash memory utilize a floating gate that is positioned above and insulated from a channel region in a semiconductor substrate. Typically, a "tunnel oxide" insulates the floating gate from the channel. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

One issue of concern is data retention. Over time, charge on the floating gate may be lost or gained across the tunnel oxide, thereby changing the threshold voltage. It is also possible to lose or gain charge across the insulator the separates the floating gate from the control gate. For some devices, losing or gaining charge across the tunnel oxide is a greater problem of these two effects.

Another phenomenon that presents problems is stress induced leakage currents (SILC). Programming and erasing memory cells may stress the insulator below the floating gates. This stress may result in a greater leakage current through the insulator.

For some memory arrays, with continued scaling the individual threshold voltage ranges that define each state are getting wider. If the individual threshold voltage ranges are wider, then the margin between the threshold voltage ranges becomes smaller (assuming the same overall width for all threshold voltage ranges). The smaller margin between threshold voltage distributions makes data retention a more significant issue.

BRIEF DESCRIPTION OF THE DRAWINGS

FIGS. 10A, 10B, 10C, 11A, 11B, 11C, 12A, 12B and 12C depict energy band diagrams.

FIGS. 16A, 16B, 16C, 16D, 16E, 16F, 16G, 16H, and 16I show results after various steps of the process of FIG. 15.

FIG. 17 is a flow chart describing one embodiment of a process for forming a memory array using diffusion of n-impurities when forming transistors having N gates.

FIGS. 18A and 18B show results after various steps of the process of FIG. 17.

DETAILED DESCRIPTION

Figure 1A:
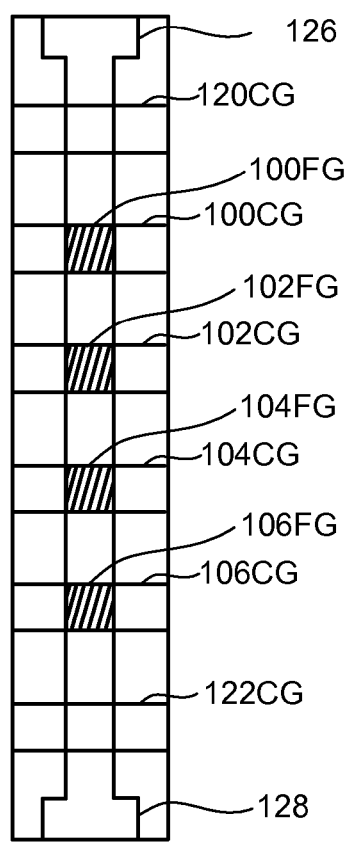
FIG. 1A is a top view of a NAND string.

With continued scaling of memory arrays, such as NAND flash, the programmed states may become wider; therefore, this leaves smaller margins for data retention and SILC. Furthermore, scaling the tunnel oxide (e.g., reducing the tunnel oxide thickness) may not be possible due to necessary margins for data retention and degradation related to SILC. Technology disclosed herein includes a "P-N" floating gate in a non-volatile storage device. The P-N floating gate may improve data retention margins while providing about the same coupling ratio as a floating gate that is entirely "N+". Having a good coupling ratio may mean that programming speed is not sacrificed. Improved data retention may, in effect, allow a greater margin between programmed states and/or may enable reduction of tunnel oxide thickness.

Non-volatile storage elements having a PN floating gate are disclosed herein. The floating gate may have a P− region near the tunnel oxide, and may have an N+ region near the control gate. In some embodiments, a P− region near the tunnel oxide helps provide good data retention. In some embodiments, an N+ region near the control gate helps to achieve a good coupling ratio between the control gate and floating gate. Therefore, programming of non-volatile storage elements is efficient. Also erasing the non-volatile storage elements may be efficient. In some embodiments, having a P− region near the tunnel oxide (as opposed to a strongly doped p-type semiconductor) may improve erase efficiency relative to P+.

In one embodiment, a thin barrier (e.g., an insulator or dielectric that is a few Angstroms thick) is used between the P− region and the N+ region. This barrier may provide a barrier to diffusion of impurities between the N+ region and the P− region, while ensuring the P− region and the N+ region are not electrically insulated from each other. Note that p-type impurities such as boron may have a high diffusivity.

Note that the barrier layer is not a requirement. For example, if diffusion of impurities between the P− region and the N+ region is not a problem, then a barrier layer might not be needed. Another option is to have an intrinsic region between the N+ region and P− region of the floating gate. Thus, one embodiment is a "p-i-n" floating gate, where "i" refers to an intrinsic region sandwiched between the p-type floating gate at the bottom and the n-type floating gate at the top.

Note that techniques for fabricating non-volatile storage devices are compatible with those for fabricating transistors. Also note that for some transistors, it might not be desirable to have a P− region near the gate oxide. Techniques are described herein for efficiently fabricating memory cells with P− regions near the tunnel oxide, along with transistors with N+ regions near the gate oxide. In some embodiments, what is initially a P− region near the transistor gate oxide is transformed into an N+ region. In one embodiment, an n-type impurity is co-implanted into what is initially a p-region to transform it into an N+ region. In one embodiment, there is not a barrier region between the N+ region and P− region for transistors. During fabrication, n-type impurities may be caused to diffuse from the N+ region into the P− region in regions where transistors are being formed.

Example Memory System and Operation

Figure 1B:
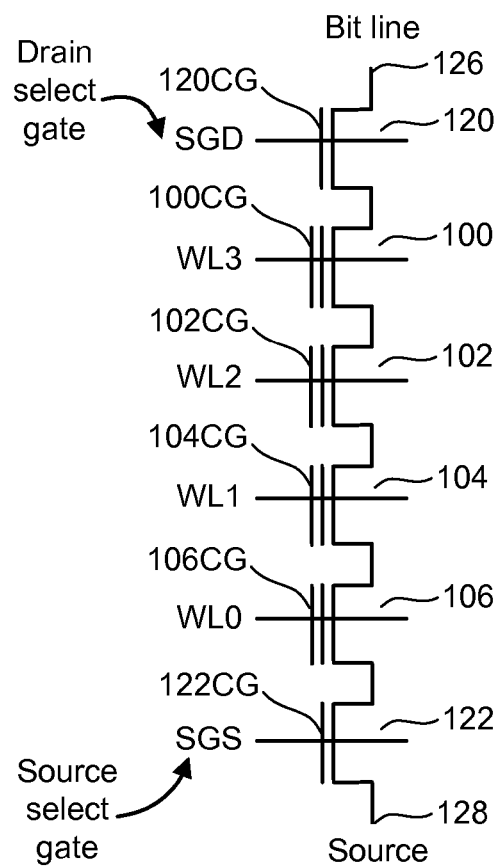
FIG. 1B is an equivalent circuit diagram of the NAND string of FIG. 1A.

One example of a memory system suitable for implementing embodiments uses a NAND flash memory architecture, which includes connecting multiple transistors in series between two select gates. The transistors connected in series and the select gates are referred to as a NAND string. FIG. 1A is a top view showing one NAND string. FIG. 1B is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2A:
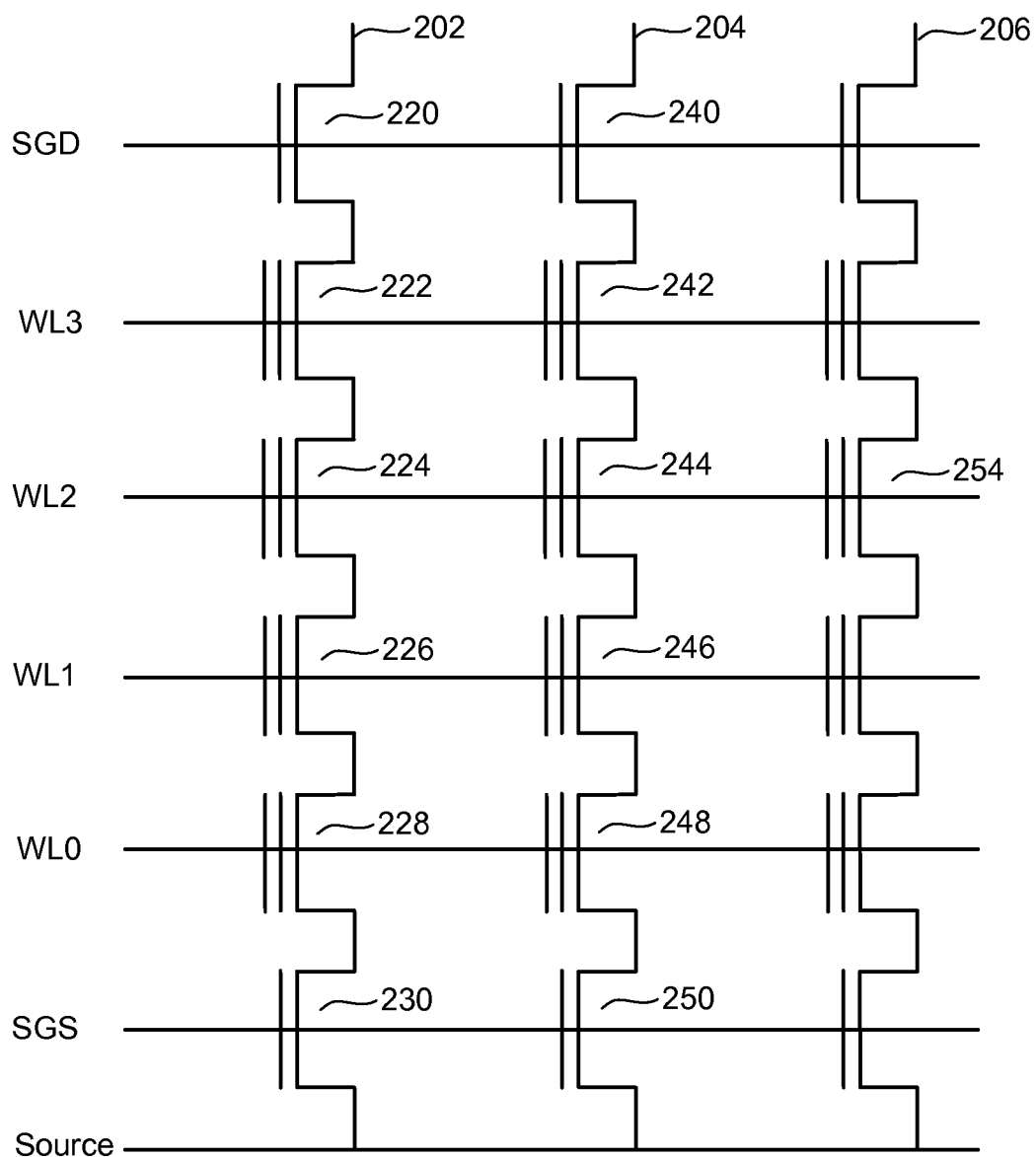
FIG. 2A is a circuit diagram of three NAND strings with associated word lines.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g., select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprises the columns of the array of memory cells. The word lines (WL3, WL2, WL1 and WL0) comprise the rows of the array.

Figure 2B:
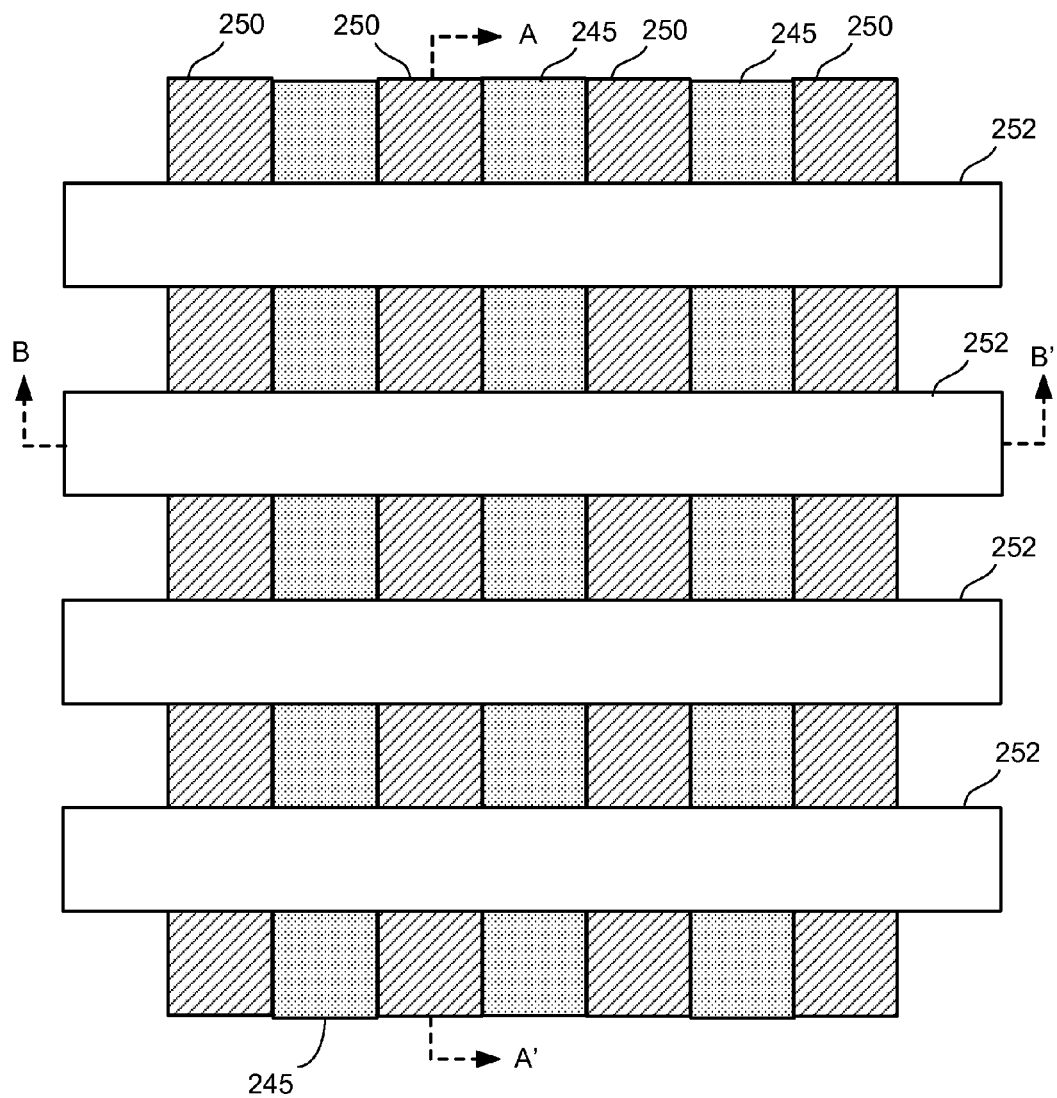
FIG. 2B is a top view of the three NAND strings and word lines.

FIG. 2B is a top view of a portion of an array of NAND flash memory cells. The array includes bit lines 250 and word lines 252. Shallow trench isolation (STI) structures 245 are depicted between the bit lines 250 (note the bit lines are not at the same level as the STI structures 245). Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2A and 2B. For example, a wordline can include thousand or tens of thousands of memory cells. The discussion herein is not limited to any particular number of memory cells in a wordline.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2A, the program voltage will also be applied to the control gates of storage elements 244 and 254.

Figure 3:
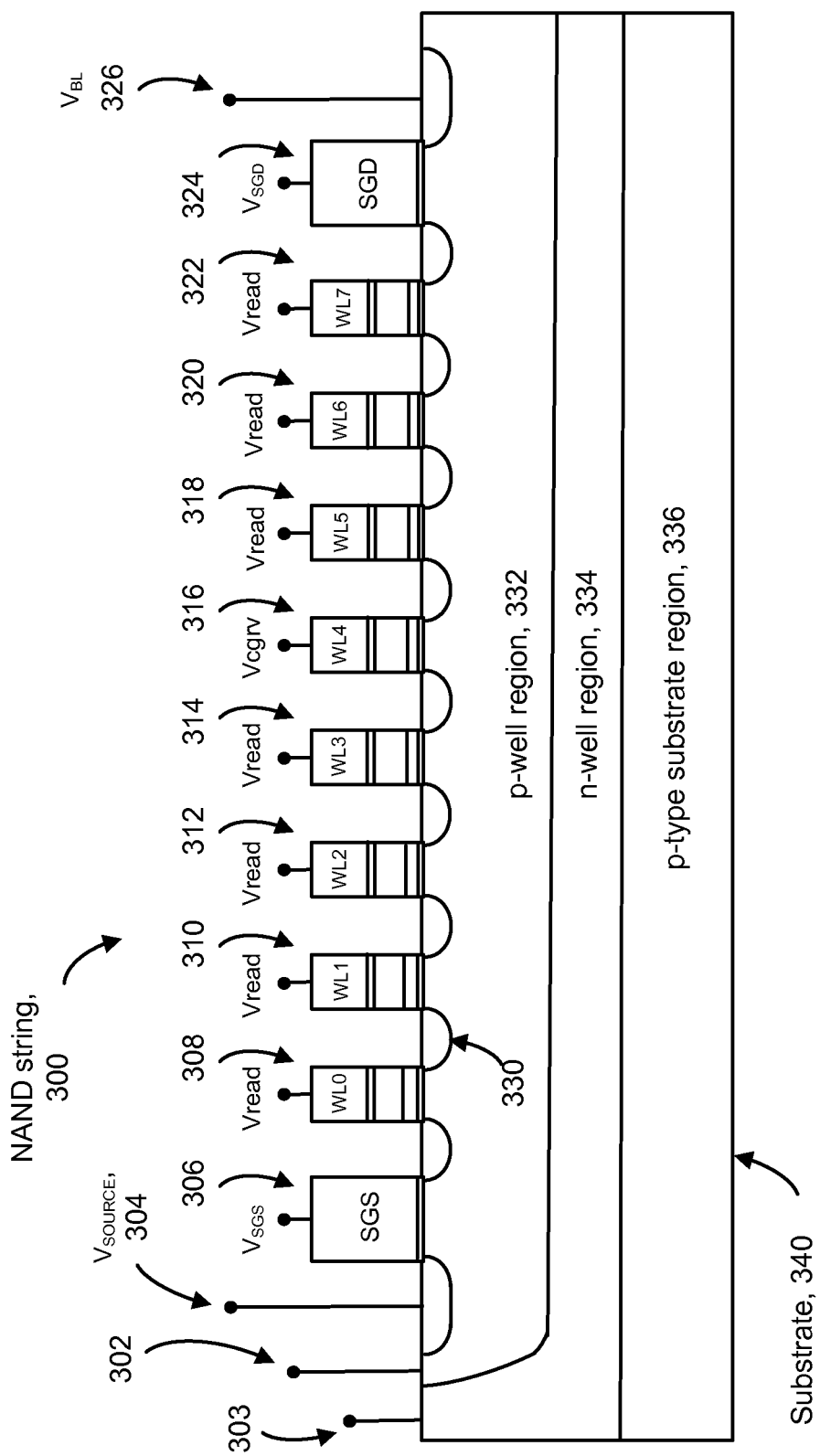
FIG. 3 depicts a cross-sectional view of a NAND string formed on a substrate.

FIG. 3 depicts a cross-sectional view of a NAND string formed on a substrate. The view is simplified and not to scale. The NAND string 300 includes a source-side select gate 306, a drain-side select gate 324, and eight storage elements 308, 310, 312, 314, 316, 318, 320 and 322, formed on a substrate 340. A number of source/drain regions, one example of which is source/drain region 330, are provided on either side of each storage element and the select gates 306 and 324.

In one approach, the substrate 340 employs a triple-well technology which includes a p-well region 332 within an n-well region 334, which in turn is within a p-type substrate region 336. The NAND string and its non-volatile storage elements can be formed, at least in part, on the p-well region. A source supply line 304 with a potential of $V_{SOURCE}$ is provided in addition to a bit line 326 with a potential of $V_{BL}$. Voltages, such as body bias voltages, can also be applied to the p-well region 332 via a terminal 302 and/or to the n-well region 334 via a terminal 303. During a read or verify operation, a control gate voltage $V_{SOURCE}$ is provided on a selected word line, in this example, WL4, which is associated with storage element 316. Further, recall that the control gate of a storage element may be provided as a portion of the word line. For example, WL0, WL1, WL2, WL3, WL4, WL5, WL6 and WL7 can extend via the control gates of storage elements 308, 310, 312, 314, 316, 318, 320 and 322, respectively. A pass voltage, $V_{READ}$ is applied to the remaining word lines associated with NAND string 300. $V_{SGS}$ and $V_{SGD}$ are applied to the select gates 306 and 324, respectively.

Figure 4:
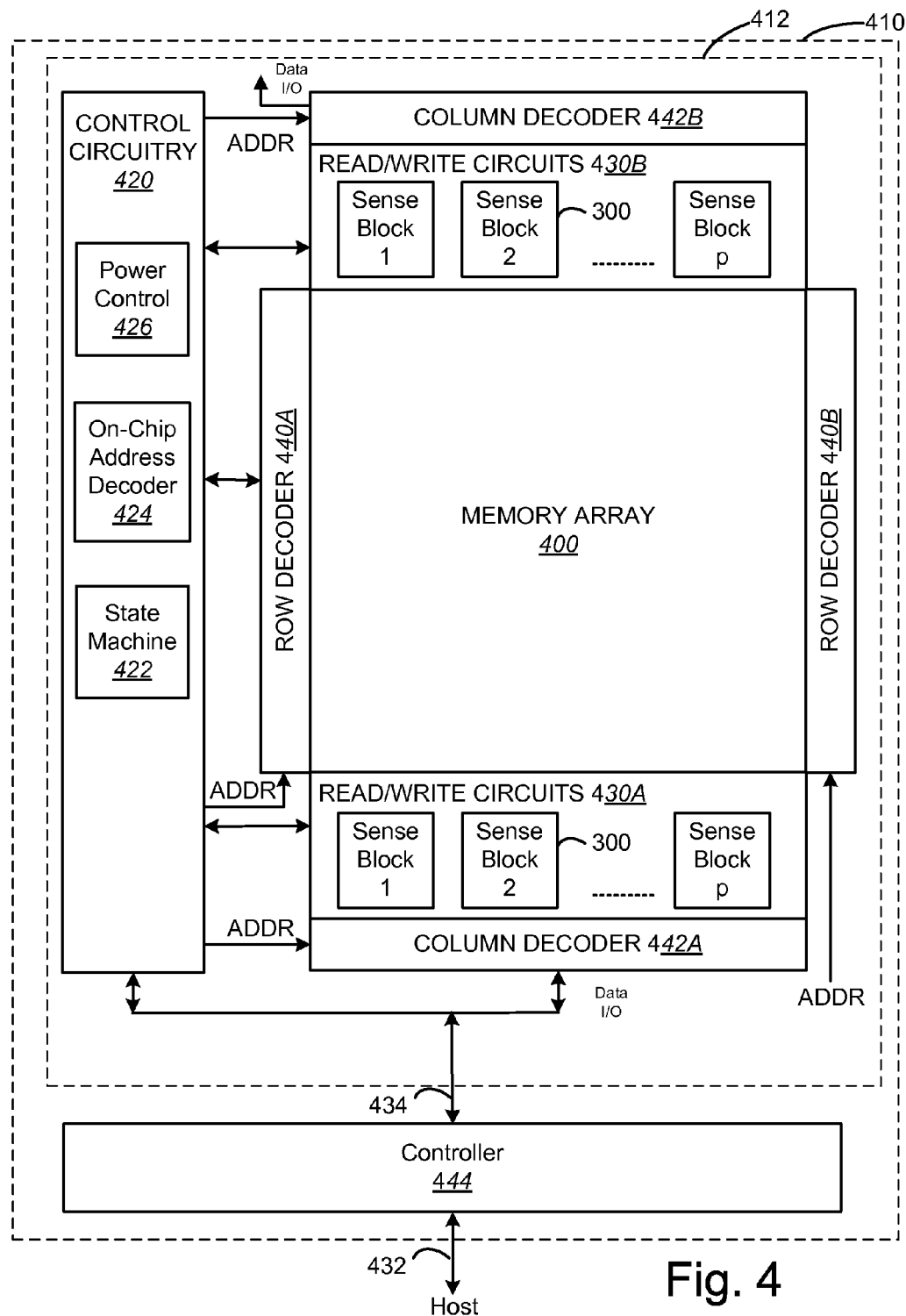
FIG. 4 illustrates a non-volatile storage device that may include one or more memory die or chips.

FIG. 4 illustrates a non-volatile storage device 410 that may include one or more memory die or chips 412. Memory die 412 includes an array (two-dimensional or three dimensional) of memory cells 400, control circuitry 420, and read/write circuits 430A and 430B. In one embodiment, access to the memory array 400 by the various peripheral circuits is implemented in a symmetric fashion, on opposite sides of the array, so that the densities of access lines and circuitry on each side are reduced by half. The read/write circuits 430A and 430B include multiple sense blocks 300 which allow a page of memory cells to be read or programmed in parallel. The memory array 400 is addressable by word lines via row decoders 440A and 440B and by bit lines via column decoders 442A and 442B. In a typical embodiment, a controller 444 is included in the same memory device 410 (e.g., a removable storage card or package) as the one or more memory die 412. Commands and data are transferred between the host and controller 444 via lines 432 and between the controller and the one or more memory die 412 via lines 434. One implementation can include multiple chips 412.

Control circuitry 420 cooperates with the read/write circuits 430A and 430B to perform memory operations on the memory array 400. The control circuitry 420 includes a state machine 422, an on-chip address decoder 424 and a power control module 426. The state machine 422 provides chip-level control of memory operations. The on-chip address decoder 424 provides an address interface to convert between the address that is used by the host or a memory controller to the hardware address used by the decoders 440A, 440B, 442A, and 442B. The power control module 426 controls the power and voltages supplied to the word lines and bit lines during memory operations. In one embodiment, power control module 426 includes one or more charge pumps that can create voltages larger than the supply voltage.

In one embodiment, one or any combination of control circuitry 420, power control circuit 426, decoder circuit 424, state machine circuit 422, decoder circuit 442A, decoder circuit 442B, decoder circuit 440A, decoder circuit 440B, read/write circuits 430A, read/write circuits 430B, and/or controller 444 can be referred to as one or more managing circuits.

Figure 5:
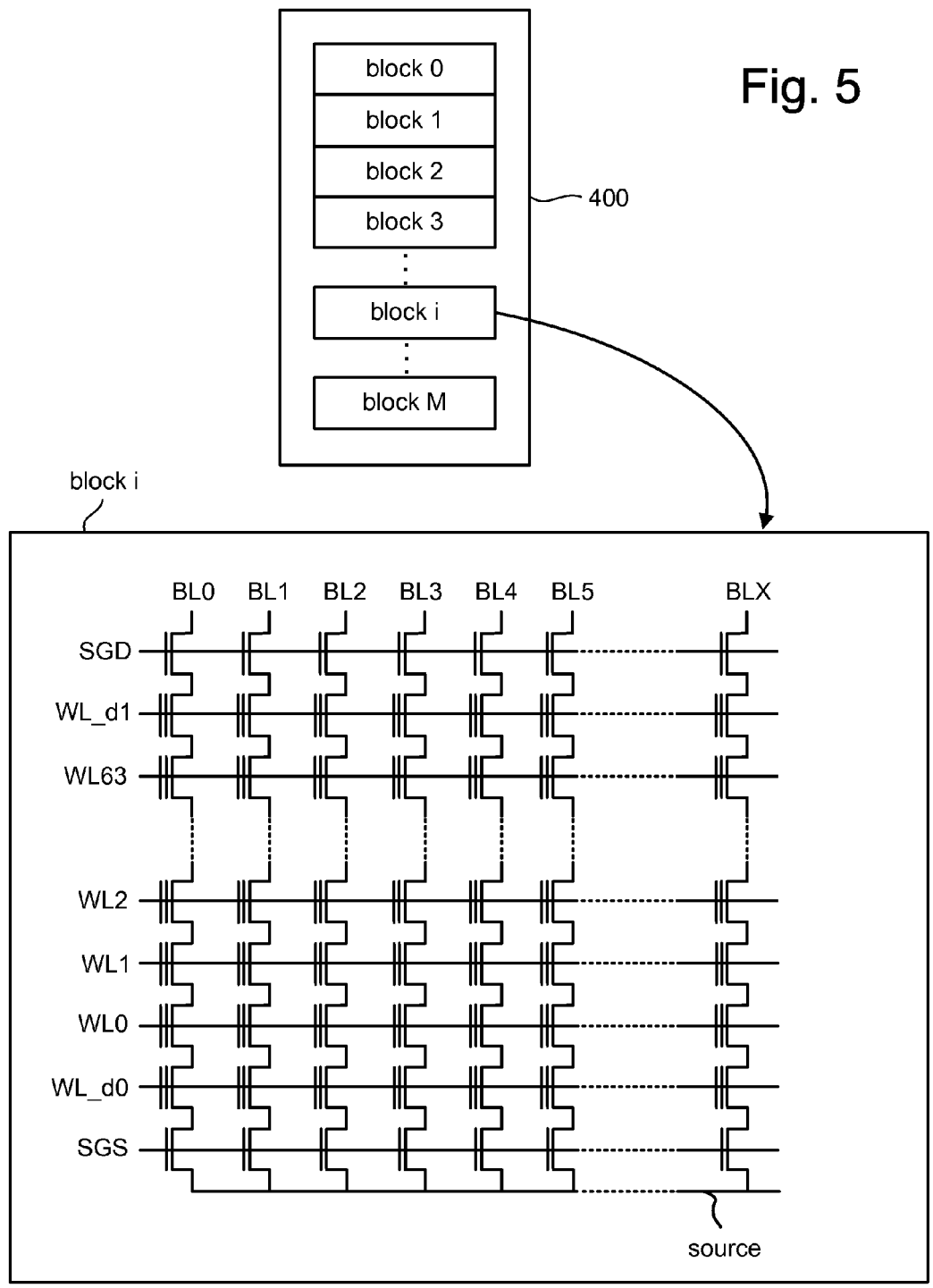
FIG. 5 depicts an exemplary structure of memory cell array.

FIG. 5 depicts an exemplary structure of memory cell array 400. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5 also shows more details of block i of memory array 400. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6:
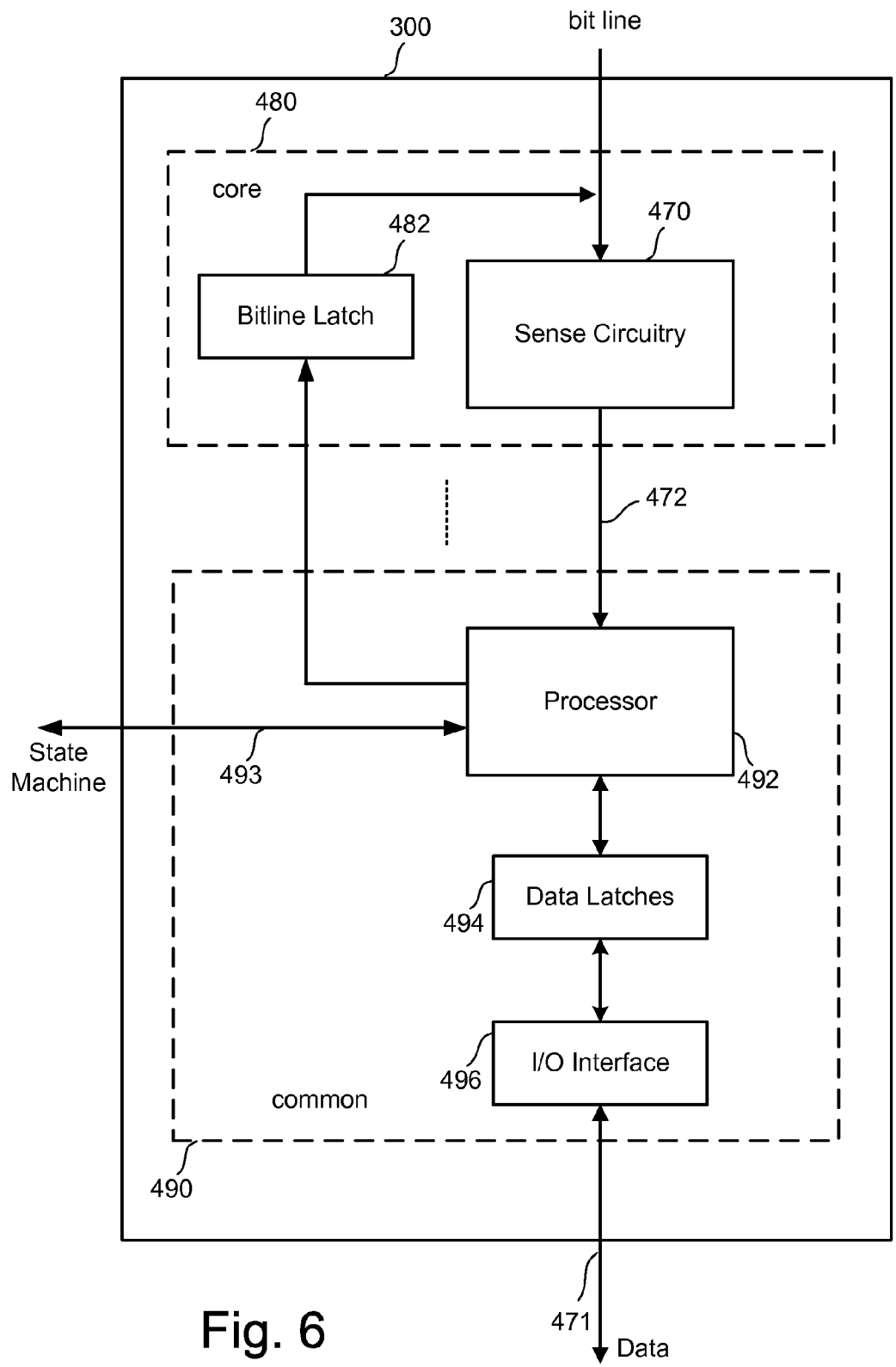
FIG. 6 is a block diagram of an individual sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is herby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Application Pub. No. 2006/0158947, "Reference Sense Amplifier For Non-Volatile Memory," published on Jul. 20, 2006. All five of the immediately above-listed patent documents are incorporated herein by reference in their entirety.

Figure 7:
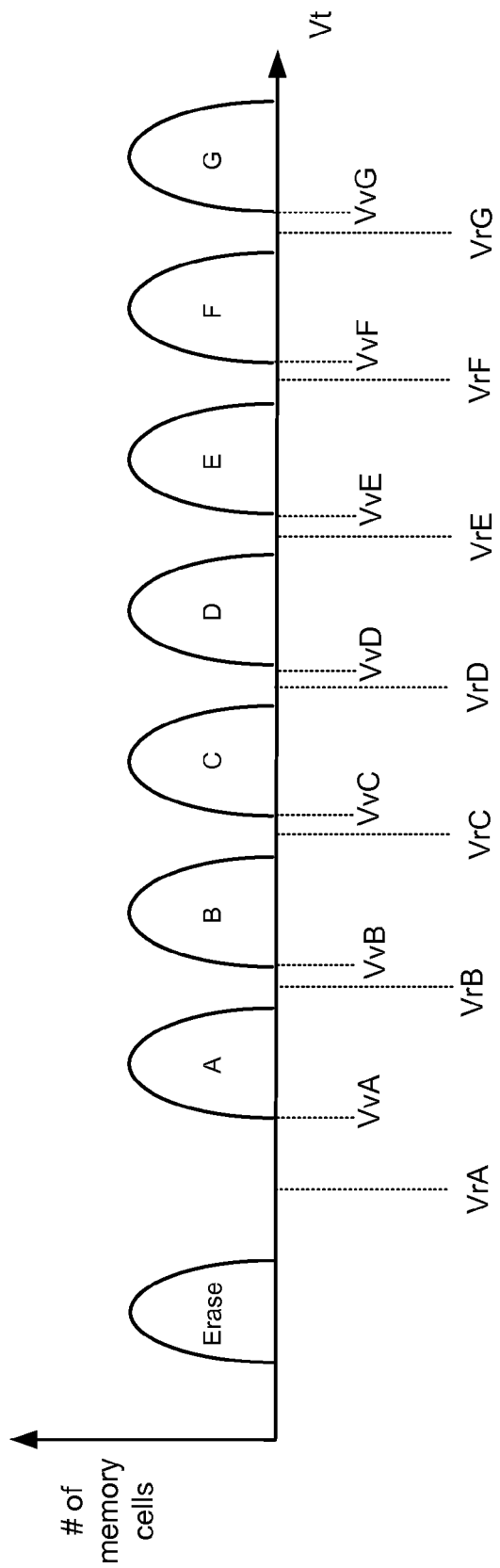
FIG. 7 depicts example threshold voltage distributions for states of memory cells in which there are eight states.

At the end of a successful programming process (with verification), the threshold voltages of the memory cells should be within one or more distributions of threshold voltages for programmed memory cells or within a distribution of threshold voltages for erased memory cells, as appropriate. FIG. 7 depicts example threshold voltage distributions for states of memory cells in which there are eight states. The eight data states include an erase state and states A-G. In this example, three bits may be stored per memory cell. Between each of the data states are read reference voltages used for reading data from memory cells. For example, FIG. 7 shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 7 shows VvA for state A and VvB for state B, etc. When programming memory cells to a given state, the system will test whether those memory cells have a threshold voltage greater than or equal to the verify reference voltage.

Example Structures

Figure 8A:
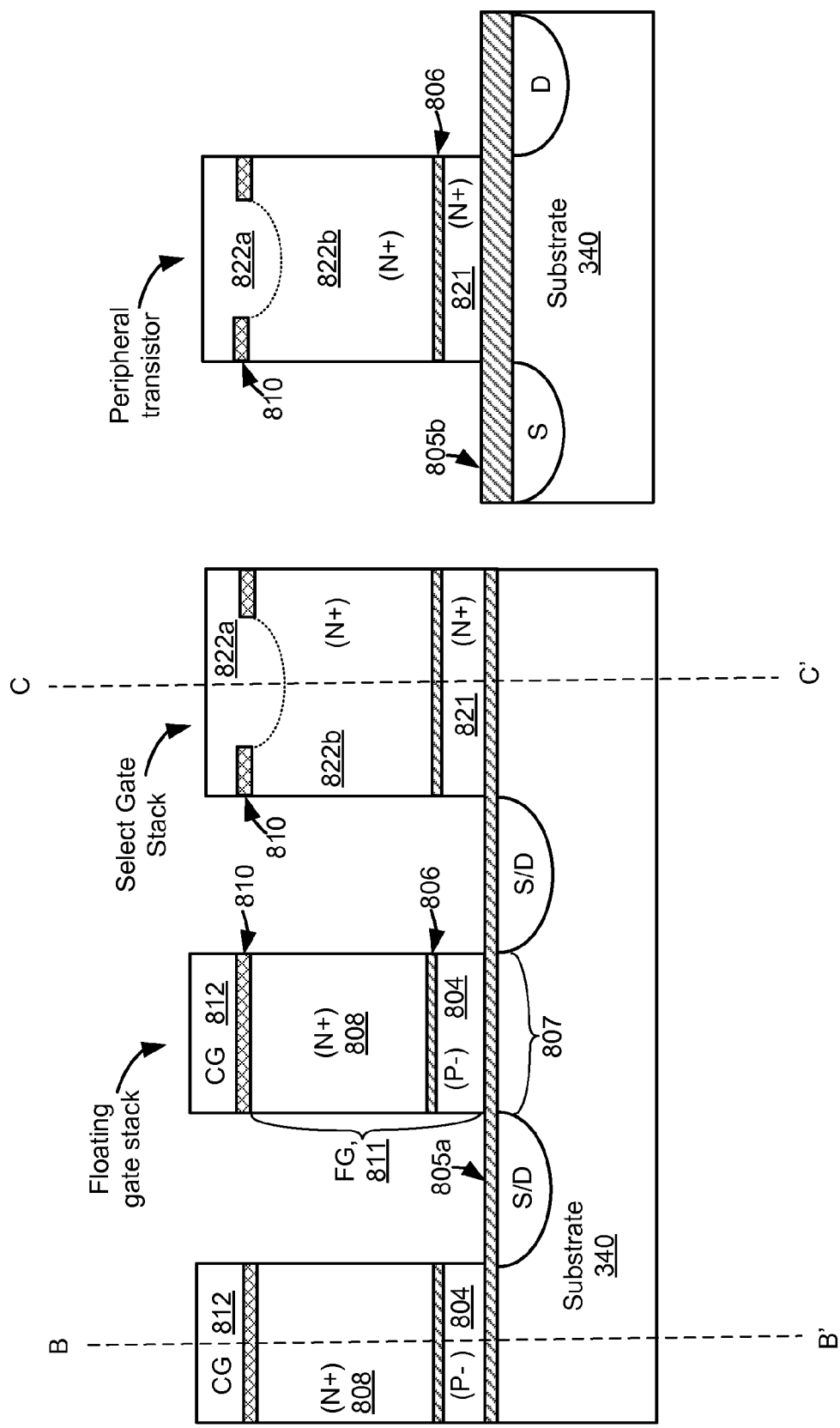
FIG. 8A depicts one embodiment of non-volatile storage elements.
Figure 8B:
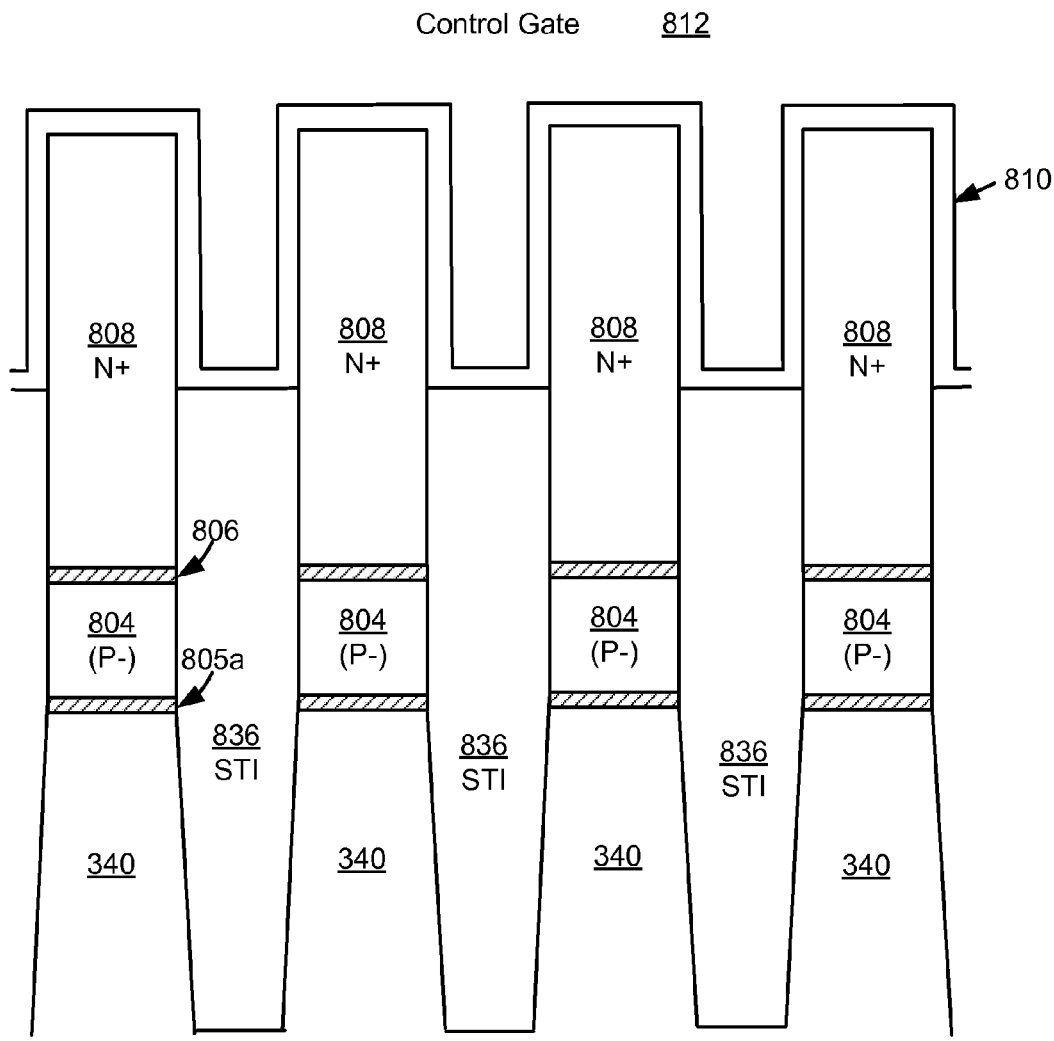
FIG. 8B is a view along a portion of line B-B' from FIG. 8A for one embodiment.
Figure 8C:
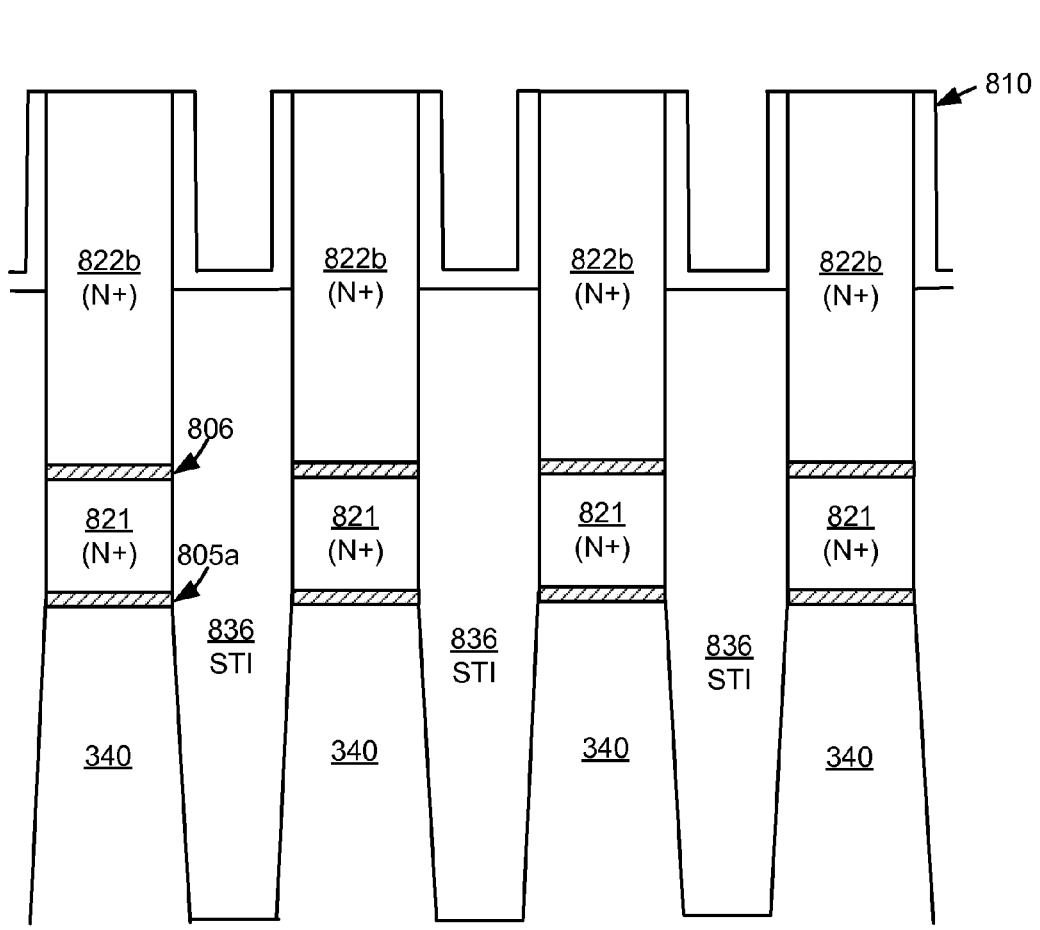
FIG. 8C shows several select gate transistors on adjacent NAND strings for one embodiment.

FIG. 8A depicts one embodiment of non-volatile storage elements and transistors. FIG. 8A is a view along a portion of a NAND string. Portions of two non-volatile storage elements on a NAND string and a select gate of that NAND string may be seen. FIG. 8A also shows a transistor in a peripheral region. FIG. 8A omits elements that are between the NAND string and the peripheral transistor. Note that the view along the NAND string corresponds to a portion of line A-A' of FIG. 2B. FIG. 8B is a view along line B-B' from FIG. 8A. FIG. 8B shows several non-volatile storage elements on adjacent NAND strings. FIG. 8C is a view along line C-C' from FIG. 8A. FIG. 8C shows several select gate transistors on adjacent NAND strings.

In FIGS. 8A and 8B, the non-volatile storage elements have a floating gate (FG) 811 with a P– semiconductor region 804 and an N+ semiconductor region 808. The FG 811 has a barrier region 806 to prevent diffusion of n-type impurities from the N+ semiconductor region 808 into the P– semiconductor region 804, as well as p-type impurities from the p– region 804 into the N+ region 808. However, the barrier region 806 allows charge carriers to cross during operation. For example, the barrier region 806 could be an insulator or dielectric such as an oxide or a nitride that is sufficiently thin to allow electrons to tunnel across. The p– region 804 resides over a tunnel oxide 805a.

Each non-volatile storage element has a control gate 812 and an inter-gate dielectric 810 between the floating gate 811 and control gate 812. The control gate 812 may be formed from doped polysilicon, from metal, or a combination thereof. The inter-gate dielectric 810 may be referred to as inter-poly dielectric (IPD) when the control gate is formed from polysilicon.

Referring now to FIG. 8A, the substrate 340 has source/drain regions (S/D), which connect the non-volatile storage elements to form a NAND string. Channel region 807 exists in the substrate 340 between the source/drain regions. Thus, channel region 807 is below the floating gate 811. More precisely, the channel region 807 is below the portion of the tunnel oxide 805 that is below the p– region 804 of the floating gate 811. Note that having the p– region 807 near the channel 807 may provide for good data retention. Moreover, erase operation is not necessarily harmed significantly by the p– region 807.

Referring now to FIG. 8B, the control gate 812 may wrap around the upper portion of the floating gate. For example, the control gate 812 may be over the top and around at least a portion of the sides of the floating gate 811. Thus, the N+ region 808 is near the control gate 812. Stated another way, the N+ region 808 borders substantial portions of the inter-gate dielectric 810 that separate the control gate 812 from the floating gate 811. It is not required that the N+ region 808 border every portion of the inter-gate dielectric 810 that separates the control gate 812 from the floating gate 811. Note that having the N+ region 808 near the control gate 812 may lead to a good capacitive coupling ratio between the control gate and floating gate during programming.

Still referring to FIG. 8B, shallow trench isolation (STI) structures 836 in the substrate 340 electrically isolates NAND strings. For example, the STI structures 836 may provide electrical isolation between source/drain regions and channels 807 of adjacent NAND strings. In this example, the STI structures 836 extend part way up the sides of the N+ regions 808. Note that the STI structures 836 might extend to a different height. For example, the STI structures 836 could extend higher or lower than depicted in FIG. 8B. In this example, a portion of the inter-gate dielectric 810 resides over the STI structures 836.

Referring back to FIG. 8A, transistors will now be discussed. The following may apply both to the select gate transistor at the end of NAND string and to the peripheral transistor. In this embodiment, the gate of a transistor is mostly (or all) N+ semiconductor. For purposes of discussion, the transistor gate includes several conductive regions (821, 822a, 822b). In this embodiment, there is a barrier region 806 between regions 821 and 822. The barrier region 806 may be the same materials and thickness as the barrier 806 in the floating gate stacks. The barrier region 806 is not a requirement in the transistor gate. A reason for its existence is that, in one embodiment, it is formed when depositing the material for the barriers 806 in floating gate stacks.

Note that although the p– region 804 may be desirable for lower portions of the floating gate 811, it may not be desirable to have a p– region in the gates of transistors. This may apply for both select gate transistors, as well as transistors in the peripheral region of the memory array. However, note that the transistor gates may be formed using similar materials used to form the floating gate stacks. For example, after initial deposition steps, the region in which transistor gates will be formed may be a p– region. For example, lower region 821 may initially be p–. Some embodiments include fabrication techniques that transform the lower region 821 from a p– region into an N+ region such that transistor gates do not have p– regions.

Referring now to upper portions of the transistor gate, a small amount of inter-gate dielectric 810 may remain in the transistor gate as a result of the fabrication process. However, the inter-gate dielectric 810 is not required. Note that in some embodiments, at least some of the inter-gate dielectric 810 is etched away in regions where transistors are formed.

Also note that the very upper portion 822a of the transistor gate may be formed from material that was deposited to form the memory cell control gates 812. In some embodiments, the control gates 812 are formed from N+ polysilicon. Therefore, the very upper portions 822a (as well as lower portions) of transistor gates may be formed from N+ polysilicon. However, at least a portion of the control gates 812 may alternatively be formed from metal. In this alternative, the very upper portion 822a of the transistor gate may be formed from metal. The dashed line in the select gate stack roughly depicts a boundary of the very upper portion 822a.

Finally, note that the gate oxide 805b in the peripheral region may be thicker, the same thickness, or thinner than the tunnel oxide 805a in the memory array region. In some embodiments, the gate oxide 805b is different thicknesses in different regions of the periphery. This may allow for regions of high-, medium-, and low-voltage transistors, for example.

FIG. 8C depicts four select gate transistors on different NAND strings. FIG. 8C is a view along line C-C' of FIG. 8A. The gate of each transistor includes a lower region 821, barrier 806, N+ region 822b, and very upper region 822a. These regions have already been discussed in connection with the discussion of FIG. 8A. As noted, the lower region 821 is N+ and may have initially been formed from the same material used to form the p-region 804 of floating gates. One embodiment described below provides counter-doping to transform the p-region to an N+ region 821. As can be seen, the inter-gate dielectric 810 has been etched back such that region 822a may have good electrical contact to N+ region 822b. Some of the inter-gate dielectric 810 may remain. Note that etching back the inter-gate dielectric 810 may reduce the height of the N+ region 822b relative to the N+ region 808 in the floating gates.

Figure 9A:
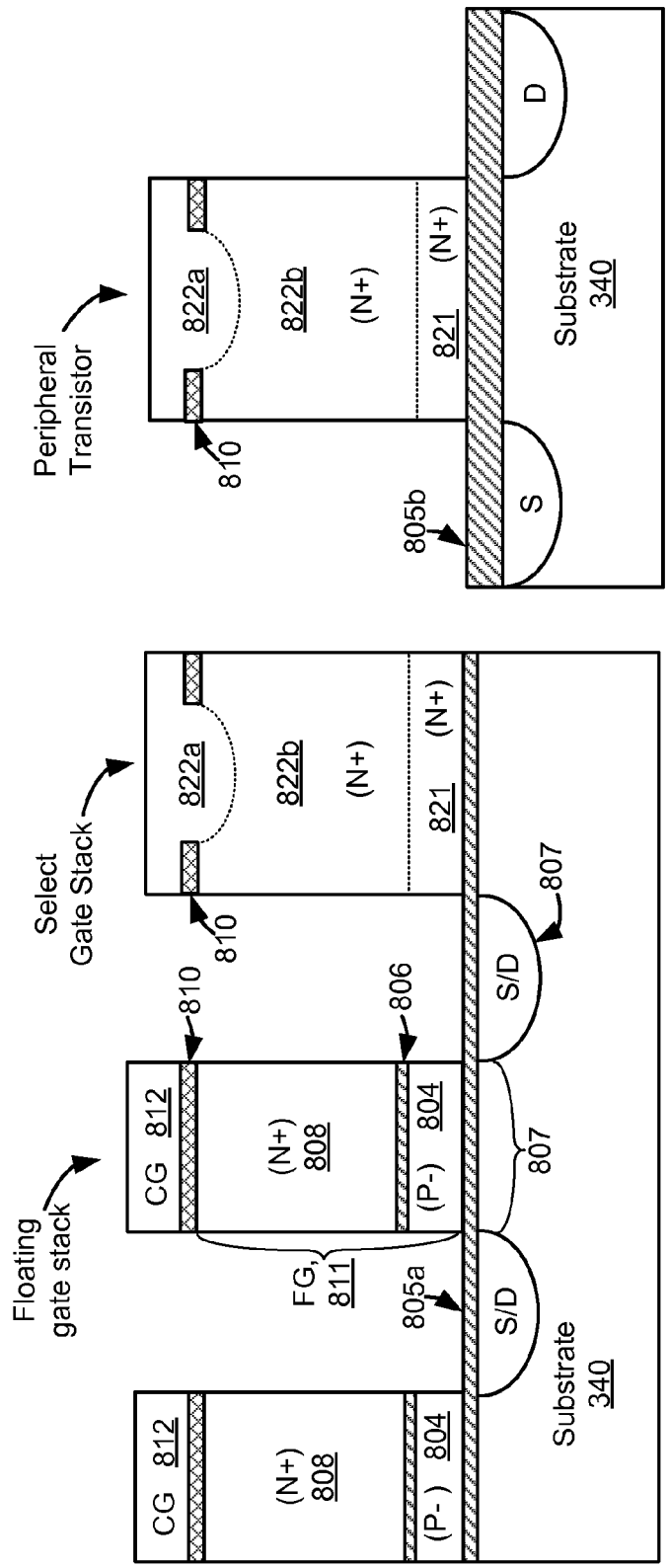
FIG. 9A depicts one embodiment in which the transistor gates do not have a barrier region.

Note that the barrier region 806 is not required in the transistor gates. FIG. 9A depicts one embodiment in which the transistor gates do not have a barrier region. For purposes of discussion, the transistor gates are divided into three conductive regions 821, 822a, 822b. In some embodiments, when material for the transistor gates is first formed, the lower region 821 is P–. However, later process steps may transform the P– region into an N+ region. For example, a thermal anneal may be used to cause diffusion of n-type impurities from region 822b into region 821.

Figure 9B:
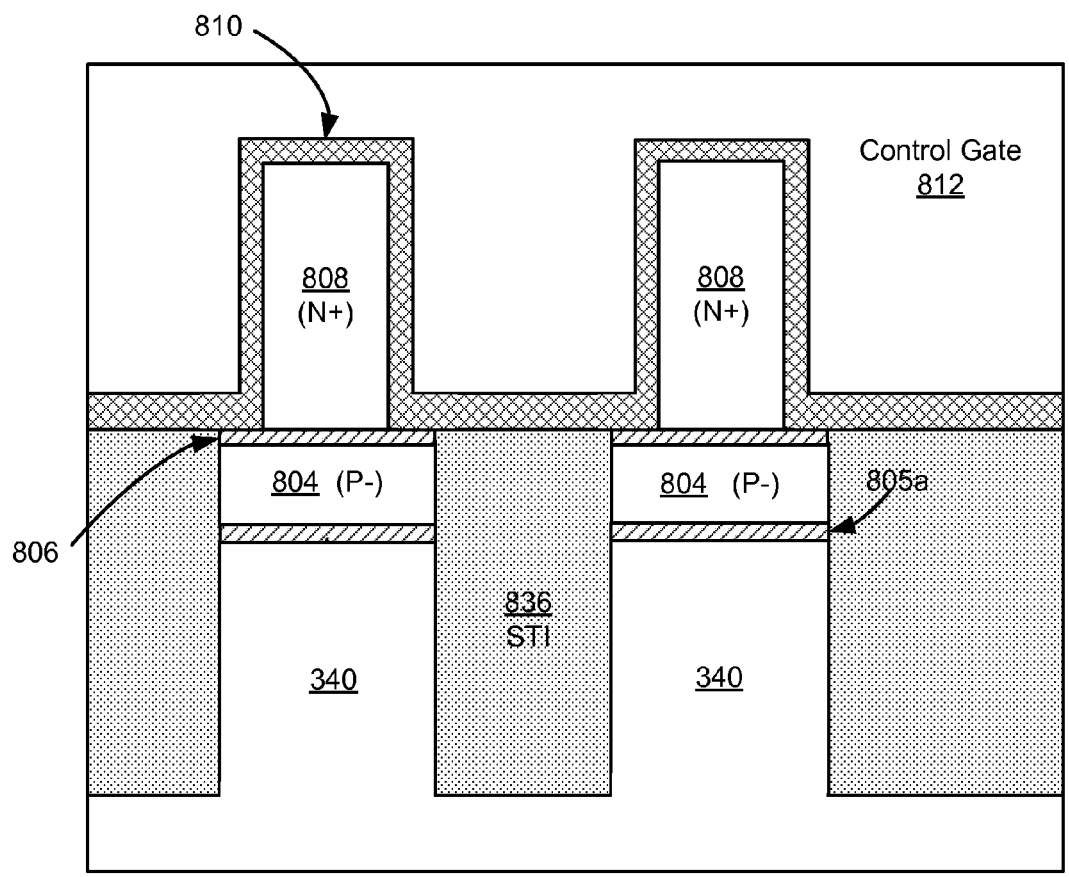
FIG. 9B depicts one embodiment in which the floating gates have an inverted T-shape.

Note that the floating gates could have a different shape. FIG. 9B depicts one embodiment in which the floating gates 811 have an inverted T-shape. FIG. 9B depicts two memory cells on adjacent NAND strings. The view is along line B-B' from FIG. 8A. Note that the view along the NAND string for this embodiment could appear similar to the embodiment of FIG. 8A.

Referring now to FIG. 9B, the floating gate 811 has a base (or lower portion) and a stem (or upper portion). In this embodiment, the p– region 804 is in the base and the N+ region 808 is in the stem. In this embodiment, the barrier region 806 is in the base, but could be in the stem instead. The p– region 804 could extend into the stem, or the N+ region could extend into the base.

In this example, the control gate 812 wraps around the upper portion of the floating gate. For example, the control gate 812 is over the top and around at least a portion of the sides of the floating gate 811. Thus, the N+ region 808 is near the control gate 812. Stated another way, the N+ region 808 borders substantial portions of the inter-gate dielectric 810 that separate the control gate 812 from the floating gate 811. It is not required that the N+ region 808 border every portion of the inter-gate dielectric 810 that separates the control gate 812 from the floating gate 811. Note that having the N+ region 808 near the control gate 812 may lead to a good capacitive coupling ratio between the control gate and floating gate during programming.

Still referring to FIG. 9B, shallow trench isolation (STI) 836 in the substrate 340 electrically isolates NAND strings. For example, the STI 836 may provide electrical isolation between source/drain regions and channels 807 of adjacent NAND strings. In this example, the STI 836 extends up to the base of the floating gate 811. Note that the STI 836 might extend to a different height. For example, the STI 836 could extend higher or lower than depicted in FIG. 8B. In this example, a portion of the inter-gate dielectric 810 resides over the STI 836.

Figure 9C:
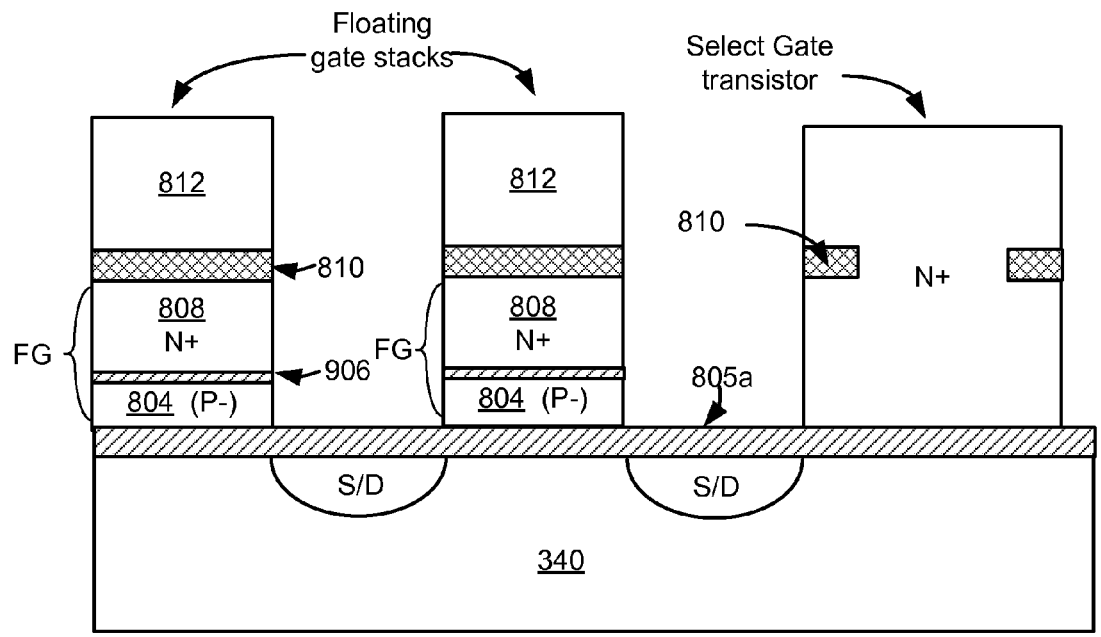
FIGS. 9C and 9D depicts embodiment of memory cells having p-i-n floating gates.
Figure 9D:
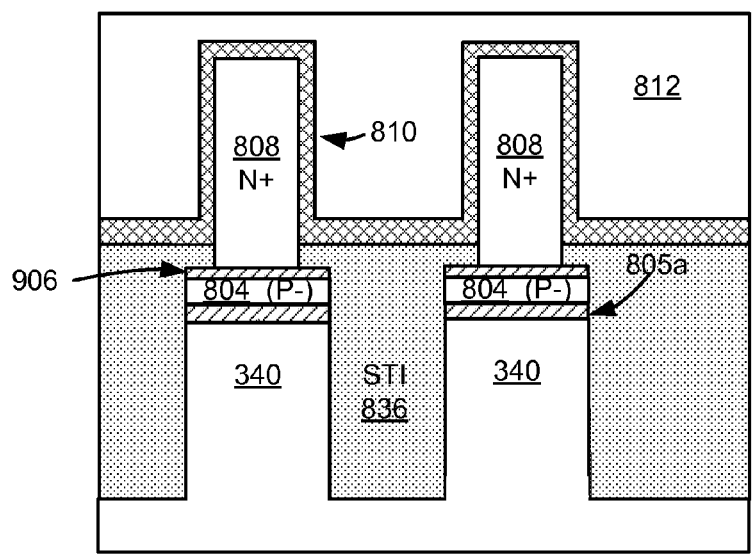

FIGS. 9C and 9D are similar to the embodiment of FIGS. 9A and 9B. However, instead of a barrier region 806, there is a region of intrinsic semiconductor 906. The region of intrinsic semiconductor 906 serves to prevent large numbers of N-type impurities from diffusing into the P-region 804. Note that during fabrication, the memory cell may be subjected to temperatures that could cause diffusion of impurities. However, if the fabrication does not have high temperatures, the floating gate could be formed without the intrinsic region or without the barrier region. Thus, neither the barrier region 806 nor the intrinsic region 906 is a requirement.

Figure 9E:
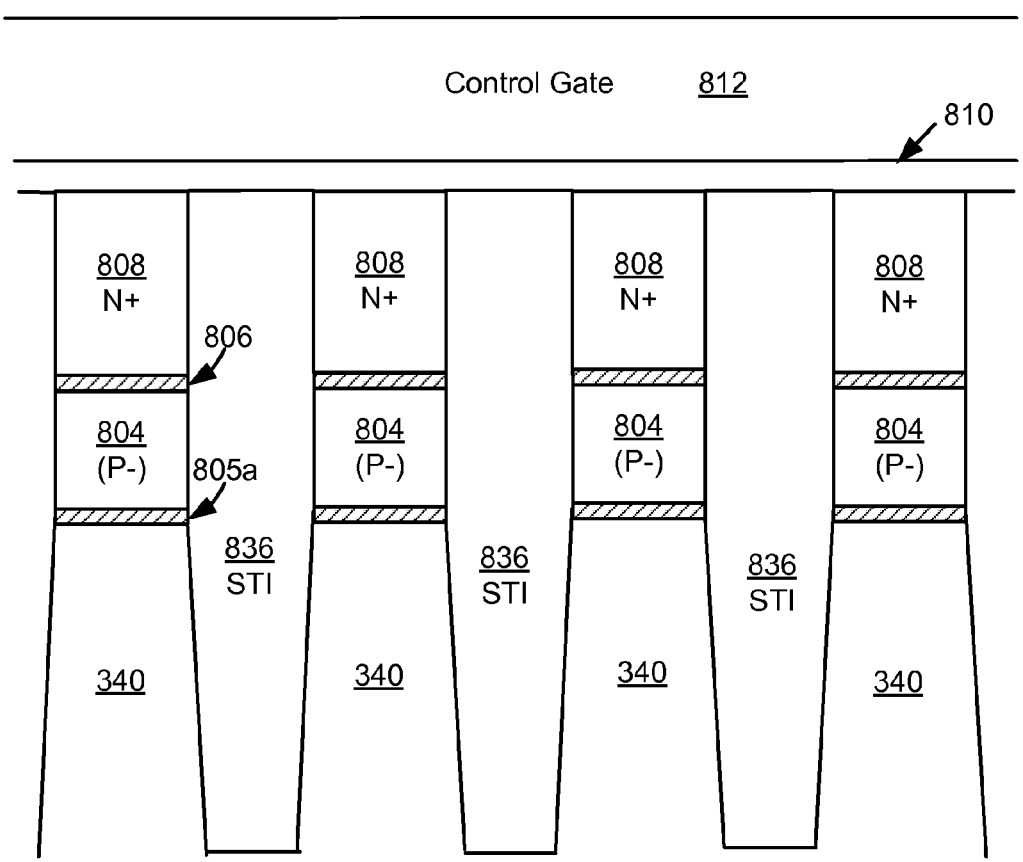
FIG. 9E is a diagram for one embodiment of memory cells along line B-B' of FIG. 8A.

One embodiment is what may be referred to as a "flat cell." In this embodiment, the control gate 812 does not wrap around sides of the floating gate 811. FIG. 9E shows a perspective for one embodiment along line B-B' of FIG. 8A. As can be seen in FIG. 9E, the control gate 812 does not wrap around the sides of the floating gate 811. In this embodiment, the inter-gate dielectric 810 does not wrap around the sides of the floating gate 811 either. The floating gate 811 has a P– region 804 bordering the tunnel oxide 805a, and an N+ region 808 bordering the inter-gate dielectric 810 between the floating gate 811 and control gate 812. Referring back to FIG. 8A, the control gate 812 does not wrap around the floating gate 811 from this perspective either.

Example Band Diagrams

Figure 12A:
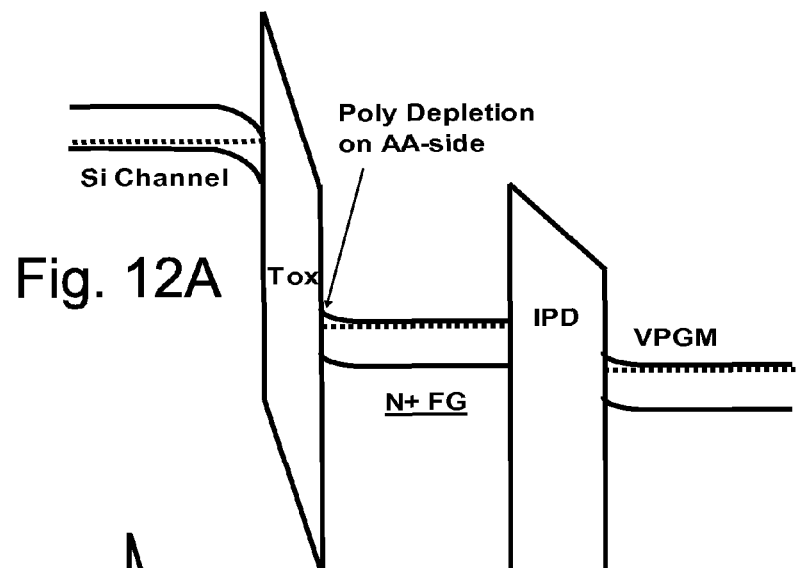
Figure 12B:
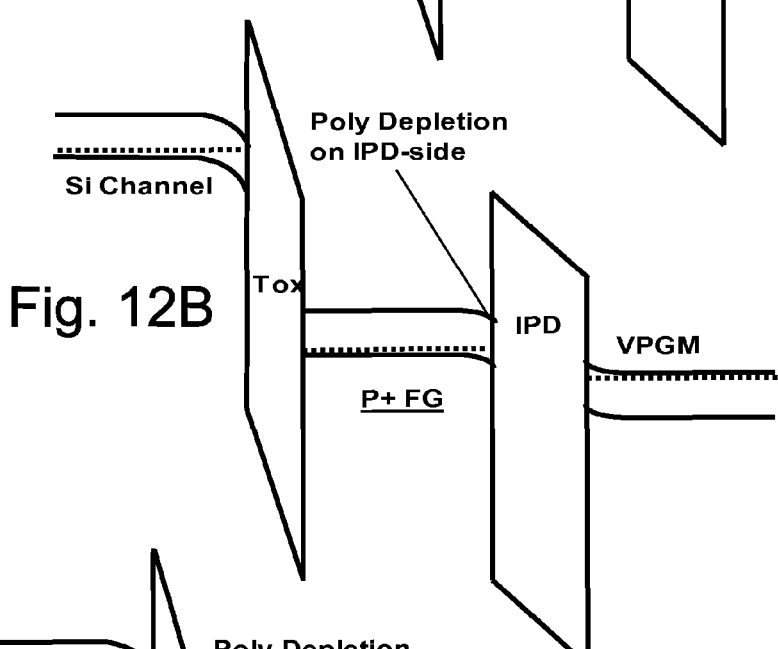
Figure 12C:
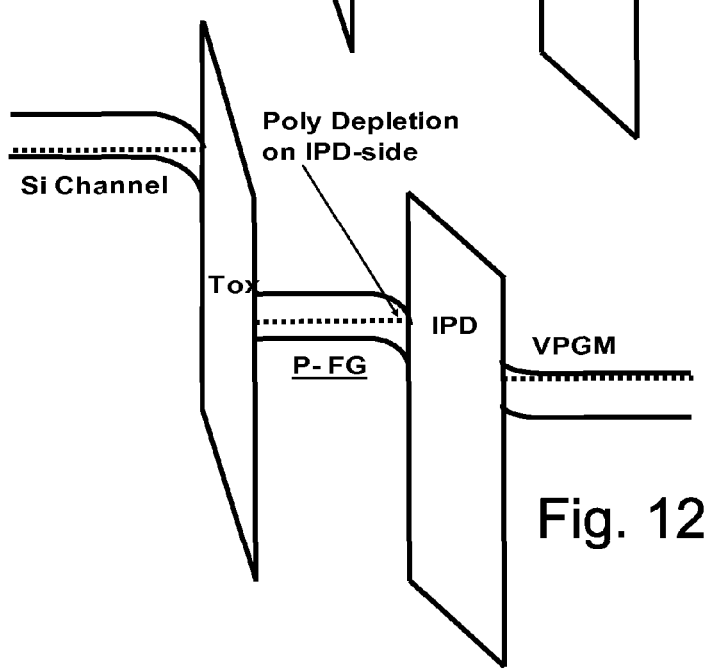
Figure 13A:
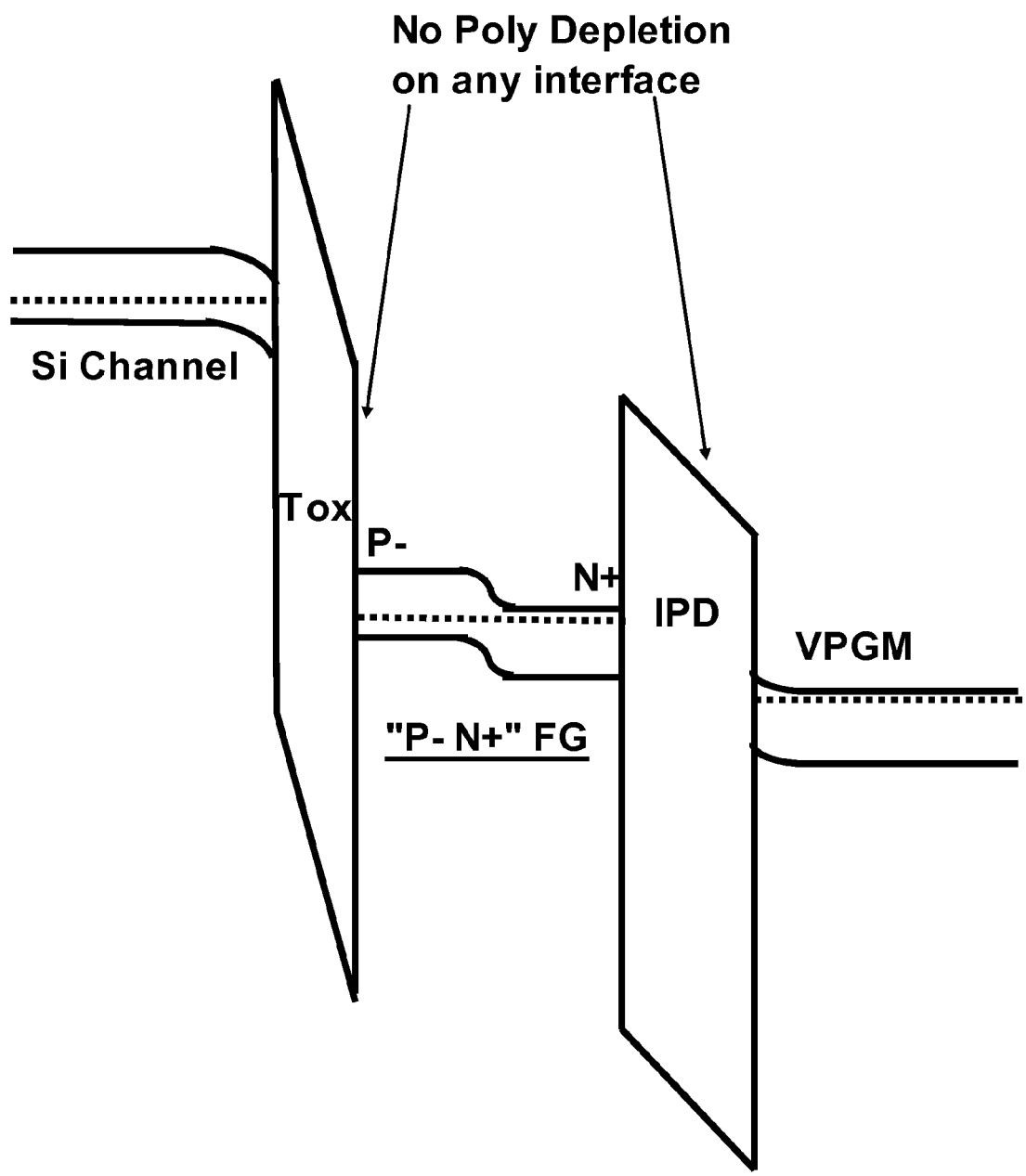
FIGS. 13A, 13B, and 13C depict energy band diagrams for embodiments of memory cells having PN floating gates.
Figure 13B:
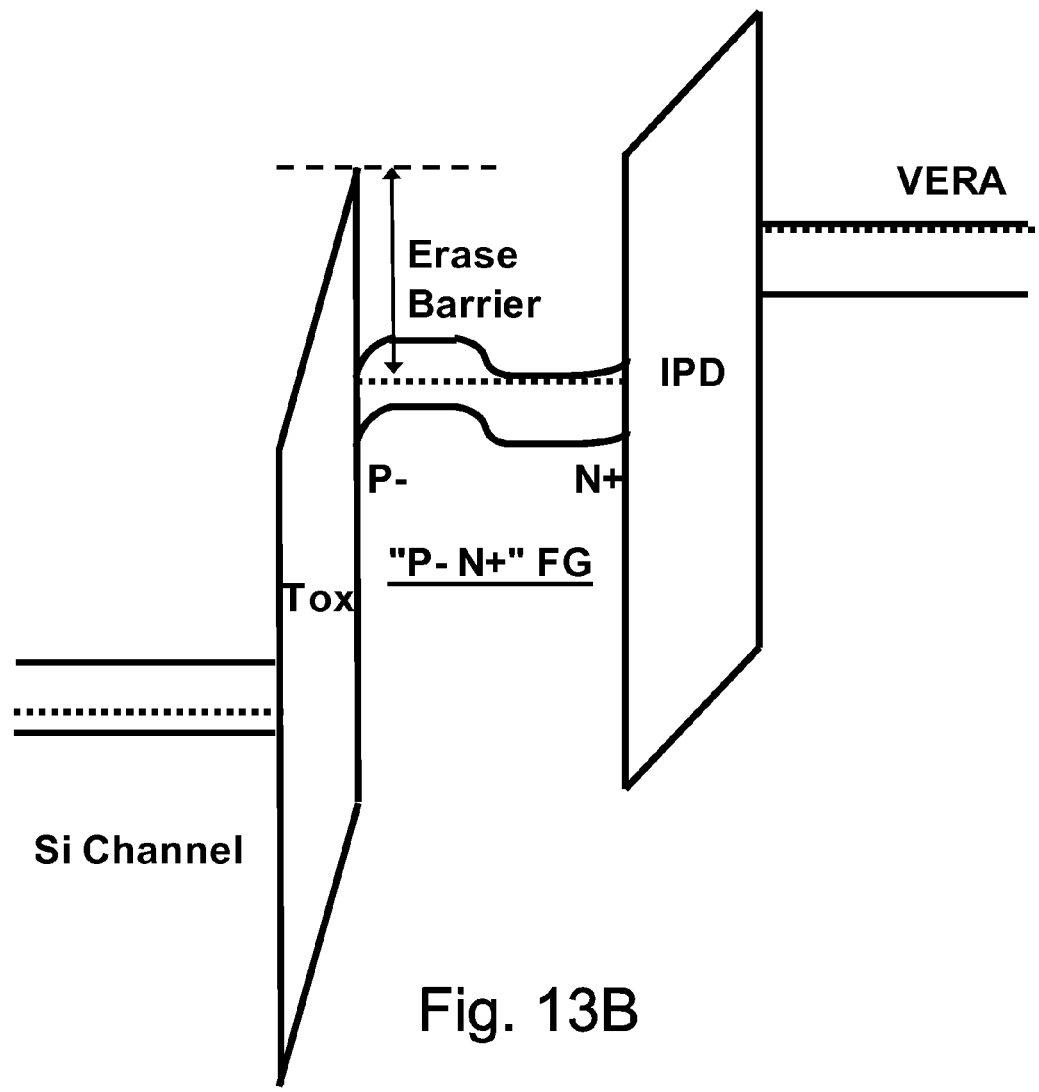
Figure 13C:
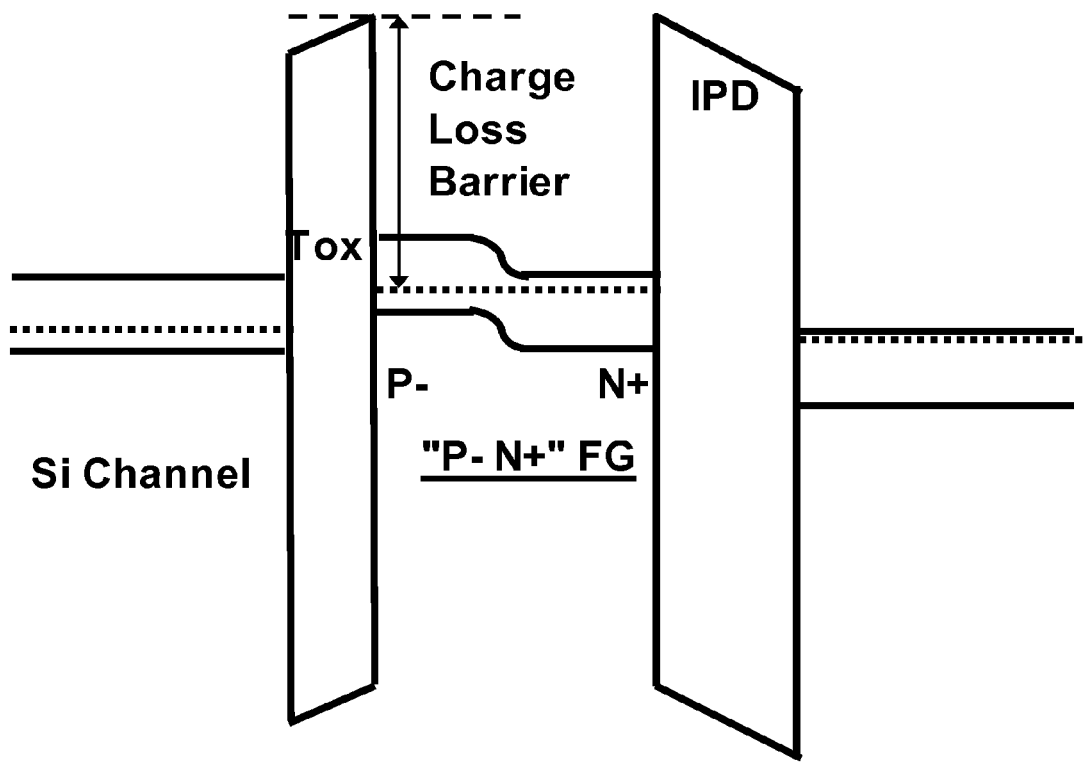

FIGS. 10A-13C depict band diagrams. FIGS. 10A-12C cover cases in which the floating gate is formed entirely from one conductivity. FIGS. 13A-13C correspond to embodiments having a floating gate (FG) that has a P– region and an N+ region. Note that the band diagrams in FIGS. 10A-12C are useful for purposes of discussion of PN floating gates.

Figure 10A:
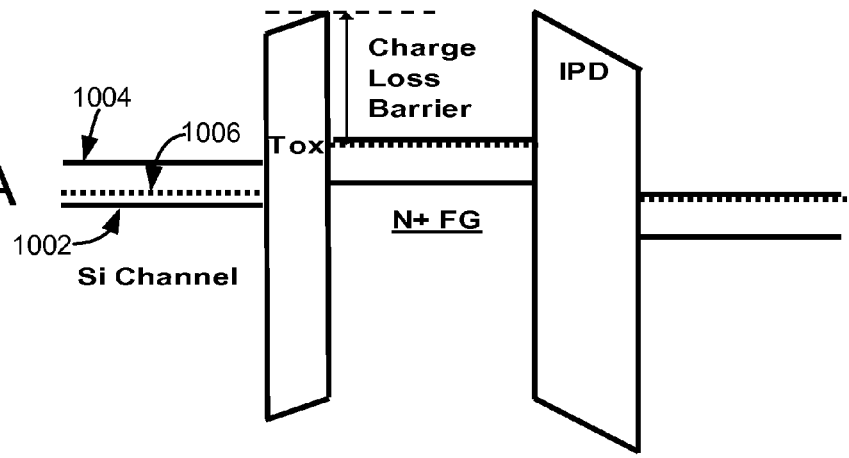
Figure 10B:
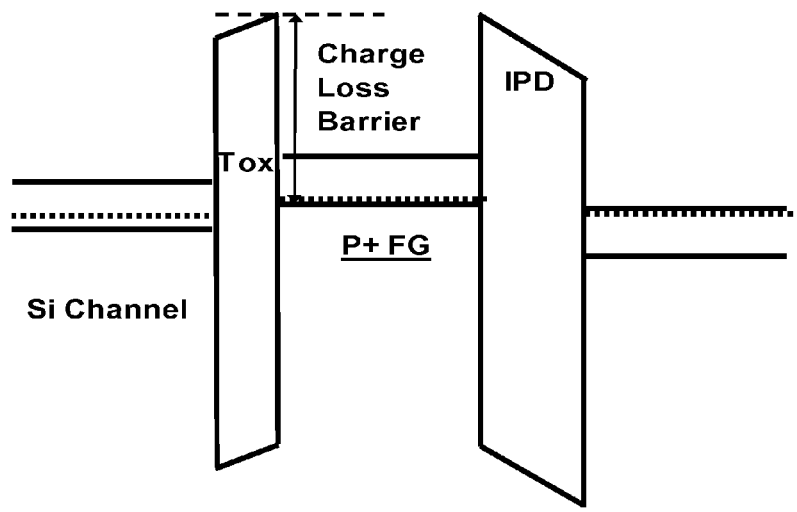
Figure 10C:
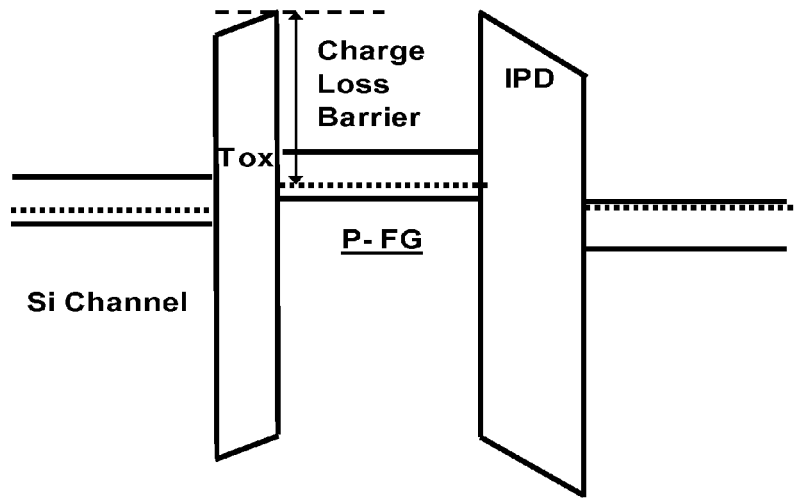

FIG. 10A is for an N+ FG. FIG. 10B is for a P+ FG. FIG. 10C is for a P– FG. FIGS. 10A-10C will be used to discuss data retention. Referring to FIG. 10A, five distinct regions are depicted from left to right. These regions correspond to a silicon channel, a tunnel oxide, an N+ floating gate, an inter-gate dielectric, and a control gate. FIGS. 10B and 10C diagrams have a similar organization, but are for different floating gate materials.

Conduction bands 1002 and valence bands 1004 for silicon regions are shown as solid lines. The Fermi levels 1006 are depicted as dashed lines. A charge loss barrier is depicted as the difference between the Fermi level 1006 of the FG and the conduction band of the tunnel oxide. As can be seen, the P+ FG of FIG. 10A offers higher barrier to electrons than the N+FG of FIG. 10A, thus improving data retention. As one example in which the channel is silicon and the tunnel oxide is $SiO_2$, the electron barrier might be about 3.1 eV for an N+ FG. However, for a P+ FG the electron barrier might be about 4.2 eV. For a P– FG, the electron barrier could be between about 3.65 eV and 4.2 eV, depending on the P– concentration, at least for some materials. Note that for some embodiments, the tunnel oxide is thinner than the inter-gate dielectric. Under this scenario charge loss (e.g., data retention) could be a greater problem across the tunnel oxide than across the inter-gate dielectric.

As will be discussed below, having a P+ region in the FG near the tunnel oxide may also make the barrier to remove electrons during erase larger than having an N+ region in the FG near the tunnel oxide may. Therefore, a FG with such a P+ region may be harder to erase than a FG having an N+ region near the tunnel oxide. FIGS. 11A-11C will be used to discuss erase. FIG. 11A is for an N+ FG. FIG. 11B is for a P+ FG. FIG. 11C is for a P− FG. Each of these diagrams shows an erase voltage (VERA) applied to the control gate. Also depicted is an erase barrier, which is the difference between the Fermi level 1006 of the FG and the conduction band of the tunnel oxide. The erase barrier for the N+ FG may be about 3.1 eV. The erase barrier for the P+ FG may be about 4.2 eV. The erase barrier for the P− FG may be about 3.1V, at least for some P− concentrations. Note that with a different P− concentration, the erase barrier may be different.

Note that for the P− FG, there may be some inversion at the tunnel oxide interface. This inversion may help lower the erase barrier. For example, note that due to the inversion the erase barrier for P− FG may be less than the data retention barrier for P− FG. In contrast, for P+ FG the erase barrier may be about the same as the data retention barrier for P+ FG. Moreover, note that the erase barrier of the P− FG may be lower than the erase barrier for the P+ FG. Because it may be desirable to have a low barrier to electrons for efficient erase operation, a P− FG may erase more efficiently than a P+ FG.

FIGS. 12A-12C are band diagrams illustrating programming characteristics of N+ FG, P+ FG, and P− FG, respectively. A program voltage, VPGM, is applied to the control gate. For N+ FG of FIG. 12A, poly-depletion may occur during programming in the FG close to tunnel oxide interface.

For P+ or for P− FG of FIGS. 12B and 12C, poly-depletion may occur in the FG close to inter-gate dielectric interface, which may result in lower coupling ratio. As a result, from programming perspective, having an N+ region in the FG near the inter-gate dielectric may perform better than having an P+ region in the FG near the inter-gate dielectric.

In one embodiment, the FG is p− near the tunnel oxide and n+ near the control gate. This may achieve good data retention, efficient erase, and efficient programming. A P− region bordering the tunnel oxide may have better data retention than N+ FG due to increased electron barrier at the tunnel oxide interface. Erase operation for a FG having a p− region near the tunnel oxide may be efficient due to inversion at the p− doped FG at the tunnel oxide interface. For example, the erase operation may be more efficient than a FG having a p+ region near the tunnel oxide. The coupling ratio of a FG having an N+ region near the control gate (e.g., bordering the inter-gate dielectric) may be better than a FG with a P+ region near the control gate.

FIGS. 13A-13C are band diagrams illustrating programming, erase and data retention characteristics of memory cell having a FG that has a p− region bordering the tunnel oxide and an n+ region bordering the inter-gate dielectric. As noted herein, the floating gate may have a barrier region 806 between the p− region and the n+ region, in some embodiments. However, because the barrier region 806 is thin enough such that p− region and the n+ region may be in electrical communication with each other, for the purpose of band-diagrams, the barrier region 806 is excluded.

FIG. 13A depicts a band diagram under programming. As can be seen, there is no polysilicon depletion at either the tunnel oxide interface or the inter-gate dielectric interface. Therefore, the coupling ratio between the control gate and floating gate may be good. Consequently, an embodiment having a PN floating gate programs efficiently.

FIG. 13B depicts a band diagram under erase. There is inversion at the FG to tunnel oxide interface, due to the FG being P− at this interface. Therefore, the electron barrier during erase may be better (e.g., less) than P+ FG and comparable to N+ FG. Consequently, an embodiment having a PN floating gate erases efficiently.

FIG. 13C depicts a band diagram to show data retention characteristics. As was demonstrated in the FIGS. 10A-10C, data retention when the FG is P− near the tunnel oxide may be better than if the FG is N+ near the tunnel oxide, and almost as good as the case in which the FG is P+ near the tunnel oxide. Thus, an embodiment having a PN floating gate has good data retention.

Process Flows

As mentioned earlier, one embodiment is a P−/N+ type of FG, and another embodiment is a P−/insulator/N+ type of FG where the insulator layer is thin enough to ensure electrical communication between the two parts of FG. In some embodiments, the P− region of the FG is co-implanted with C or N. Another embodiment is a P−/intrinsic/N+ type of FG.

Since the FG may have a P− region and an N+ region, then transistors formed during the same process could potentially have a P− region and an N+ region. For example, select gate transistors in a NAND string and/or periphery CMOS transistors could potentially have a gate P− region and an N+ region. In this case, the P− region would be near the gate oxide. However, it may be desirable to avoid having a P− region near the gate oxide of the transistor. One possible reason for this is that such a P− region may alter the threshold voltage. For example, the threshold voltage could be increased. In one embodiment, a gate replacement technique is used to physically replace a P− region with an N+ region, such that the transistor gates may be entirely N+ (or at least N+ near the gate oxide).

Figure 14:
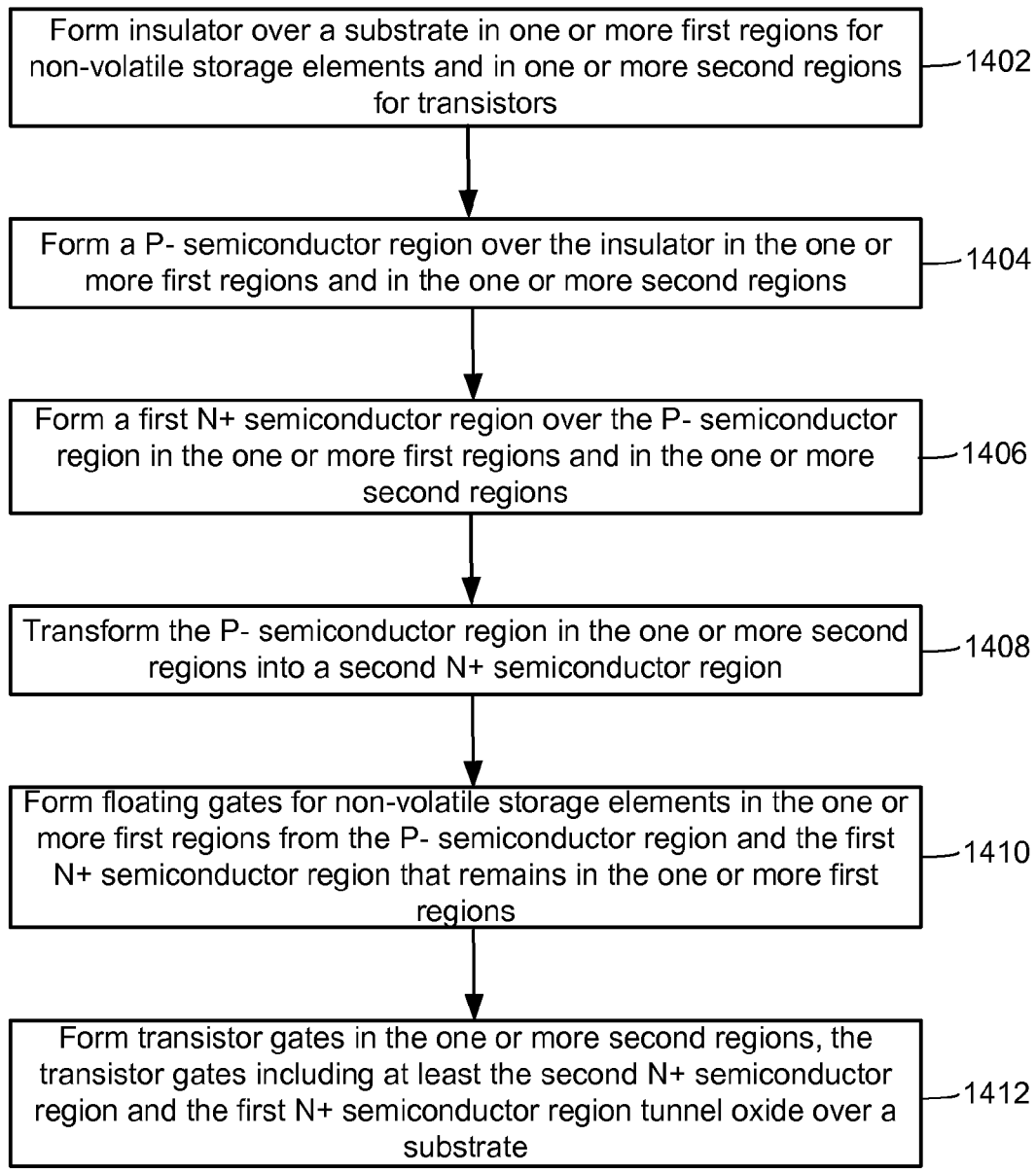
FIG. 14 is a flowchart of one embodiment of a process of forming a memory array with memory cells having PN floating gates and transistors having N gates.
Figure 15:
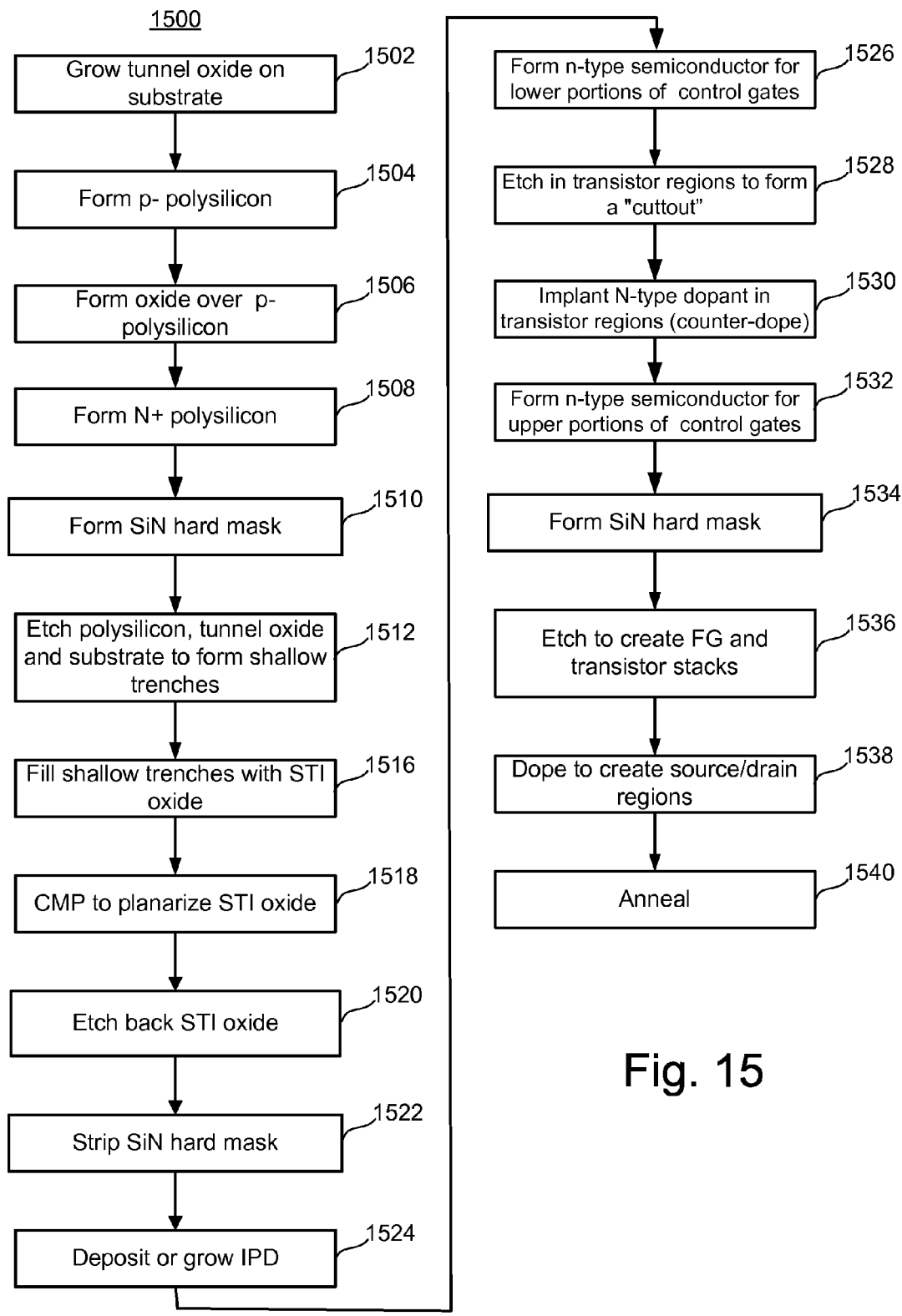
FIG. 15 is a flow chart describing one embodiment of a process for forming a memory array using counter-doping when forming transistors having N gates.

Another alternative is to transform the P− region instead of physically replacing it. FIGS. 14, 15, and 17 describe process flows in accordance with various embodiments of transforming a P− region into an N+ region, such that the transistor gates may be entirely N+ (or at least N+ near the gate oxide). Therefore, transistors may be efficiently formed during the same process as forming memory cells having P− region and an N+ region in the floating gate.

FIG. 14 is a flowchart of one embodiment of a process 1400 of forming a memory array. Process 1400 may be used to form devices such as, but not limited to, those of FIGS. 8A-9D. Step 1402 is forming an insulator over a substrate 340. The insulator may be formed in one or more first regions for non-volatile storage elements and in one or more second regions for transistors. The insulator may be for a tunnel oxide 805a for memory cells or for a gate oxide 805b for transistors. The second regions could be for peripheral transistors or for select gate transistors, as two examples.

Step 1404 is forming a P− semiconductor region over the insulator in the one or more first regions and in the one or more second regions. This P− region may eventually be used for lower portions of floating gates that border the tunnel oxide. It may also be used for part of transistor gates, after it is transformed into N+ semiconductor. The doping concentration in the P− region may be chosen to achieve a desired balance of various performance characteristics such as data retention and erase efficiency. As noted, a weak p-type doping level may provide better erase efficiency than a heavy p-type doping. However, data retention may improve when p-type doping is heavier. A suitable level of p-type doping may be selected to achieve desired erase efficiency, while also providing desired data retention. In one embodiment, the level of p-type doping is selected such that, at least during erase operation, there will be some depletion near the FG-to-tunnel oxide interface, which lowers the energy barrier such that electrons may cross the tunnel oxide more easily.

Step 1406 is forming a first N+ semiconductor region over the P− semiconductor region in the one or more first regions and in the one or more second regions. This first N+ region may be for upper portions of floating gates. It may also be used for part of transistor gates.

Step 1408 is transforming the P− semiconductor region in the one or more second regions into a second N+ semiconductor region (908). Steps in FIG. 15 are directed to one embodiment of transforming the P− semiconductor region. Steps in FIG. 17 are directed to another embodiment of transforming the P− semiconductor region. Note that transforming the P− semiconductor region does not require physically replacing semiconductor in the P− region.

Step 1410 is forming floating gates for non-volatile storage elements in the one or more first regions from the P− semiconductor region and the first N+ semiconductor region that remains in the one or more first regions.

Step 1412 is forming transistor gates in the one or more second regions. The transistor gates may include at least the second N+ semiconductor region and the first N+ semiconductor region.

FIG. 15 is a flow chart describing one embodiment of a portion of a process 1500 for forming a portion of a memory array. Process 1500 is one embodiment of process 1400. Note that the flowchart does not describe all implant steps, the gap fill of etched volumes between the floating gate stacks, or forming the contacts, metallizations, vias, and passivation, as well as other portions of the manufacturing process known in the art. There are many ways to manufacture memory according to embodiments and, thus, the inventors contemplate that various methods other than that described by FIG. 15 can be used. While a flash memory chip will include core memory and peripheral circuitry, the process steps of FIG. 15 are intended only to describe in general terms one possible process for the fabrication of portions of a memory array. For example, the floating gates can be formed to have many different shapes. In some embodiments, the floating gates have a relatively wide base with a relatively narrow stem above the base. FIGS. 16A-16I show results after various steps of process 1500, and will be referred to during discussion.

Step 1502 includes growing oxide material on top of a silicon substrate. The substrate may be etched in preparation for growing the tunnel oxide. The substrate may be etched to different levels, based on the thickness of tunnel oxide that is desired. Then, a tunnel (or gate) oxide layer may be grown over the substrate in both the memory array and peripheral region. In one embodiment, the oxide may be planarized.

In step 1504, a p-type semiconductor is formed over the oxide layer. For example, a polysilicon layer that will be used to form the floating gates is deposited over the oxide material using CVD, PVD, ALD or another suitable method. Thus, the semiconductor may be silicon. This layer may be doped as deposited or doped after depositing. In one embodiment, this layer is a p− (also referred to as a weakly doped p-layer). As one example, the doping concentration may be $1.0 \times 10^{19}/cm^3$. However, the doping concentration could be lower or higher. An example impurity is boron.

In step 1506, a layer of oxide may be formed over the p-type semiconductor. This oxide will serve as the barrier layer. As an example this may be about 5-8 Angstroms. In one embodiment, this layer of oxide is formed on both the regions where memory cells are to be formed and where transistors are to be formed. Note that the transistors could be select gate transistors (e.g., in a NAND string) or transistors in the periphery. In one embodiment, nitride is formed instead of oxide in step 1506. Note that step 1506 is optional.

In step 1508, an N+ semiconductor region may be formed over of the layer of oxide. This layer may be for upper portions of floating gates, as well as for portions of transistor gates. As one example, the doping concentration may be $8.0 \times 10^{19}/cm^3$. However, the doping concentration could be lower or higher. An example impurity is phosphorous.

FIG. 16A shows results after step 1508. FIG. 16A shows various layers in a region in which memory cells on several NAND strings are being formed and a region in which a peripheral transistor is being formed. The view may be along the line B-B' in FIG. 8A. FIG. 16A shows the results after initial steps to form a structure similar to the one of FIG. 8B, with a peripheral transistor also being formed. There is an oxide layer 1605a, 1605b over a substrate 340. Note that the oxide layer 1605b is thicker in the region for the peripheral transistor, than the layer 1605a in the NAND string region. Parts of the P− region 1604 will eventually become lower parts of floating gates. Other parts will be transformed into N+ regions for transistor gates. At this point in the process, both regions still have a P− region 1604. Layer 1606 will become the barrier region 806. Layer 1608 will be used for upper portions of floating gates, as well as a portion of transistor gates.

In step 1510, a SiN hard mask is formed over the N+ polysilicon layer to allow etching to form STI structures. Forming the SiN mask may be performed as follows. First, SiN is deposited over the entire polysilicon layer using, for example, CVD. Next, a photoresist layer is added over the SiN. The photoresist is exposed and developed to form a mask pattern. The pattern is transferred to the SiN, thus forming the SiN hard mask.

In step 1512, shallow trench isolation trenches are formed based on the SiN hard mask. In step 1514, the polysilicon layer, the oxide material, and the top of the silicon substrate are etched. In one embodiment, the etch is approximately 0.2 microns into the substrate to create shallow trench isolation (STI) areas, where the bottom of the trenches are inside the top of the P-well. Forming the shallow trench isolation trenches also etches the polysilicon into strips that run in the direction of what will become NAND strings. Thus, the STI structures will separate adjacent NAND strings.

In step 1516, the STI trenches are filled with isolation material such as partially stabilized zirconia (PSZ), SiO$_2$ (or another suitable material) up to the top of the SiN hard mask using CVD, rapid ALD or another method. In step 1518, chemical mechanical polishing (CMP), or another suitable process, is used to polish the isolation material flat until reaching the SiN hard mask.

Step 1520 is etching back the STI isolation material. Step 1522 is removing the SiN hard mask. FIG. 16B depicts results after step 1522. FIG. 16B is the same orientation as FIG. 16A. FIG. 16B depicts STI structures 836 separating what will become memory cells on different NAND strings. In this embodiment, the STI structures 836 extend part way up the N+ regions 1608' of what will become floating gates. Note that the floating gates are not yet completely formed. Later steps of process 1500 will discuss completing formation of the floating gates. Thus, the N+ portions 1608' will eventually become N+ regions 808 in floating gates. Likewise, barrier portions 1606' may be etched further to become barrier regions 806. Oxide portions 1605a' will be used for the tunnel oxide 805a.

In step 1524, the inter-gate dielectric is grown or deposited. The inter-gate dielectric may include alternating conformal layers of oxide and nitride. For example, an Oxide Nitride Oxide (ONO) inter-poly dielectric is used. In one embodiment, the inter-gate dielectric comprises nitride-oxide-nitride-oxide-nitride.

In step 1526, a first layer of polysilicon (or another semiconductor) is formed for lower portions of control gates of memory cells (note that this may also be used for transistor gates). In some embodiments, this is N+ semiconductor (either as deposited, or doped later).

In step 1528, etching is performed in transistor regions to form a "cuttout". This cuttout cuts through at least some of the inter-gate dielectric in the transistor regions. A control gate/IPD cutout is made in regions in which control gates of transistors (e.g., select gate transistors) will be formed. The cutouts may also be formed in regions where control gates of periphery transistors will be formed. A reason for these cutouts is to form control gates that do not have the IPD forming a barrier. In other words, whereas memory cells have a floating gate that is separated from the control gate by the IPD, gates of transistors should not have a floating gate. Therefore, a portion of the IPD is removed where select gates and other transistors will be formed. FIGS. 16C-16D depict results after step 1528. FIG. 16C depicts results along the view similar to FIGS. 16A-16B. FIG. 16C shows a conformal layer of inter-gate dielectric 810 over the N+ polysilicon 1608' in the NAND string region. Over that is a polysilicon region 1612, which may be used for lower parts of control gates. Region 1612 may be N+ semiconductor. Note that a "cuttout" has been made at least through the inter-gate dielectric 810 where the peripheral transistor is being formed. It is acceptable for some inter-gate dielectric to remain in the transistor gate region. However, all of the inter-gate dielectric may be removed in the transistor gate region.

FIG. 16D shows initial formation of a part of a NAND string, but does not depict formation of a peripheral transistor. However, note that the NAND string has a select transistor at the end. FIG. 16D shows results along the view similar to FIG. 8A. FIG. 16D shows various layers of materials that have already been discussed. Note that from this view, the inter-gate dielectric 810 is a relatively flat layer, although this is not a requirement. A "cuttout" has been made at least through the inter-gate dielectric 810 in preparation for forming the gate of the select transistor. It is acceptable for some inter-gate dielectric 810 to remain in the transistor gate region. However, all of the inter-gate dielectric 810 may be removed in the transistor gate region.

In step 1530, an N-type dopant is implanted (through the cuttout) in the transistor regions to counter-dope the p− regions where transistors are being formed. Thus, the lower portions of the transistor gates may be turned into an N+ region. However, this counter-doping is not performed where memory cells are being formed.

The N-type impurity is implanted with a suitable energy and concentration such that the P− region is transformed into an N+ region. Note that a mask may not be required over the regions where memory cells are being formed because that region is to be N+ anyway. In some embodiments, step 1530 serves to also provide the doping for the lower part of the control gates of the memory cells. Note that step 1530 is one embodiment of step 1408 from FIG. 14.

FIG. 16E-16F depict results during step 1530, in which an N-type impurity is being implanted to transform the P− region into an N+ region. FIG. 16E depicts results along the view similar to FIGS. 16A-16C, showing N+ region 1604'. FIG. 16F depicts results along the NAND string similar to FIG. 16D, showing N+ region 1664.

In step 1532, a second layer of polysilicon (or another material) is formed for the control gates of memory cells (note that this is also used for transistor gates). In some embodiments, this is N-type (either as deposited, or doped later). In one embodiment, metal is formed instead of depositing a semiconductor in this step. Thus, the upper portions of control gates may be metal. FIGS. 16G-16H depict results after step 1532. FIG. 16G depicts results along the view similar to FIGS. 16A-16C. FIG. 16H depicts results along the view similar to FIGS. 16D, 16F. Note that this most recent layer 1614 has been shown cross-hatched in order to separate it visually from other region. Layer 1614 may be metal or doped polysilicon.

In step 1534, a mask layer may be formed over the second layer 1614 of polysilicon. A pattern is formed in the mask such that etching can later be performed to create floating gate stacks and control gates or transistors. In one embodiment, a SiN hard mask is patterned as follows. SiN may be deposited over the entire third layer of polysilicon using, for example, CVD. In step 1536, a photoresist layer may be added over the SiN. The photoresist may be exposed and developed to form a mask pattern. The pattern is transferred to the SiN, thus forming the SiN hard mask. Floating gate stacks and transistor stacks may be formed by etching based on the mask.

In step 1538, doping may be performed to create source/drain regions for memory cells, as well as a source and/or drain regions for transistors (e.g., select gate transistor, periphery transistors). The hard mask may remain in place while doping to create the source/drain regions. Later the hard mask may be removed. In step 1540, a thermal anneal is performed. This thermal anneal serves to diffuses the dopants that were implanted during step 1538. The oxide layer in the floating gates presents the N+ dopant from diffusing into the p− region.

Figure 16I:
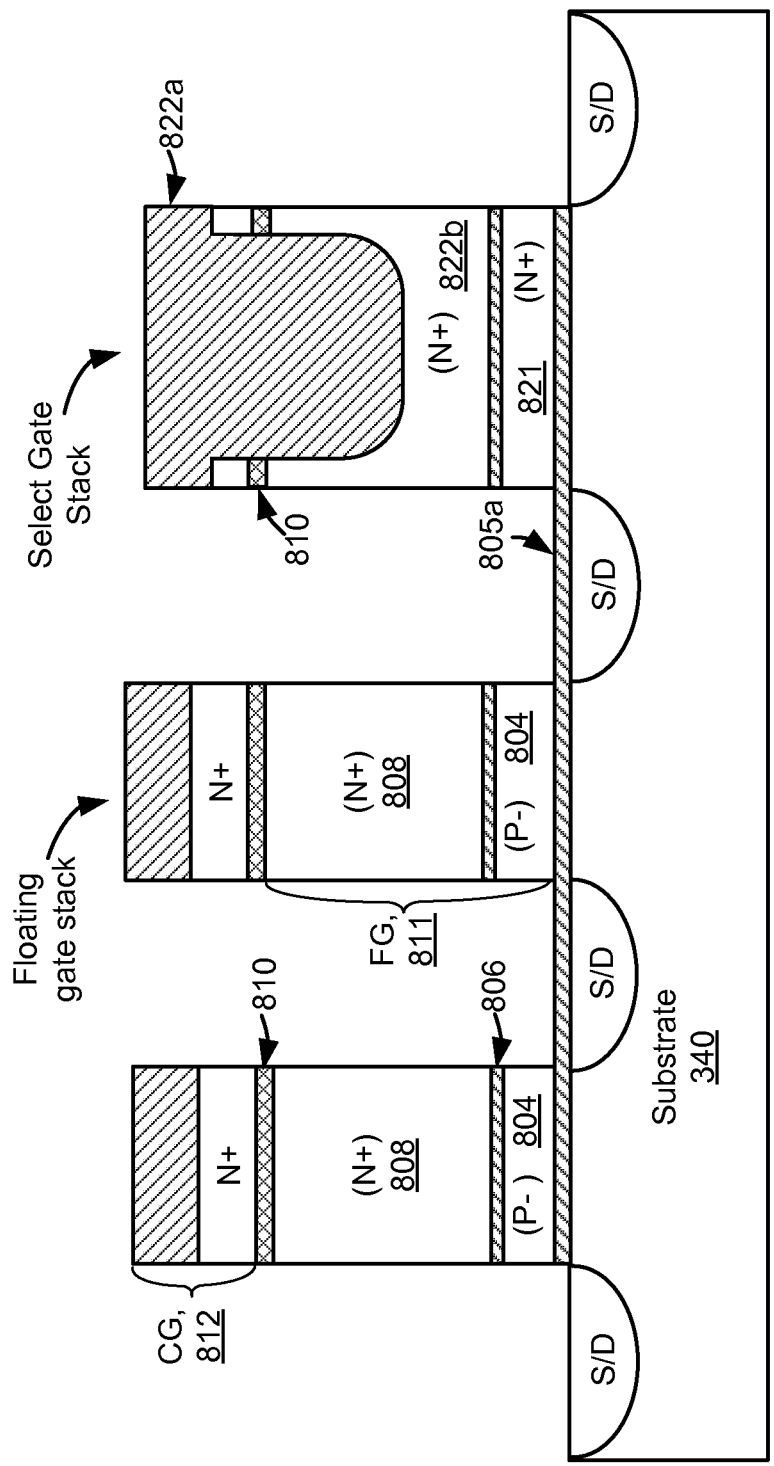

FIG. 16I depicts results after step 1540. FIG. 16I shows the view along the NAND string similar to FIGS. 16D, 16F, 16H. Note that the diagram is not necessarily to scale. For example, source/drain regions of the transistors might be wider than for the memory cells. Likewise, the transistor gate might be wider than the width of floating gate stacks.

FIG. 17 is a flow chart describing one embodiment of a portion of a process 1700 for forming a portion of a memory array. Process 1700 is one embodiment of process 1400. This flow chart does not describe all implant steps, the gap fill of etched volumes between the floating gate stacks, or forming the contacts, metallizations, vias, and passivation, as well as other portions of the manufacturing process known in the art. There are many ways to manufacture memory according to embodiments and, thus, the inventors contemplate that various methods other than that described by FIG. 17 can be used. While a flash memory chip will include core memory and peripheral circuitry, the process steps of FIG. 17 are intended only to describe in general terms one possible process recipe for the fabrication of portions of a memory array. For example, the floating gates can be formed to have many different shapes. In some embodiments, the floating gates have a relatively wide base with a relatively narrow stem above the base.

Some steps of process 1700 are similar to process 1500 and will not be described in detail. Differences include removing the barrier layer from transistor regions prior to adding the N+ polysilicon layer (steps 1708-1712). Later, a thermal anneal is performed to cause the N+ impurities to diffuse into the p– region (step 1721), thus resulting in an N+ region. Therefore, the transistor gates may be essentially entirely N+. Note that counter-doping of the transistor gate (step 1530 of process 1500) need not be performed in the process of FIG. 17.

Steps 1502-1506 are similar to process 1500 in which oxide is formed over a substrate, p– silicon is formed, and an oxide is formed over the p– silicon. Note that the oxide over the p– region will be for the barrier region and could be a different material, such as nitride.

In step 1708, a mask is formed over regions in which memory cells are to be formed. In step 1710, the oxide (for the barrier) is removed in regions in which the mask is not present. Thus, the mask prevents removal of the oxide from regions in which memory cells are to be formed. In step 1712, the mask is removed. In step 1508, an N+ region of silicon is formed over the barrier oxide in regions in which memory cells are to be formed and over the p– silicon in regions in which transistors are to be formed. FIG. 18A depicts results after step 1712. FIG. 18A is similar to FIG. 16A in that it depicts initial formation of memory cells in a NAND string region a transistor in a peripheral region. The oxide 1606 has been removed from the peripheral region. However, the oxide 1606 remains in the NAND string region. Note that the oxide 1606 may be removed from regions in which select transistors of NAND strings are to be formed.

Steps 1510-1520 describe formation of STI structures and have already been discussed with respect to FIG. 15. Step 1721 is performing a thermal anneal. This may occur during etch back of the STI oxide. Performing the thermal anneal may serve to diffuse the N+ impurities from N+ region 1608 into P– region 1604 in regions where transistors are being formed. The thermal anneal may also cause some p-type impurities to diffuse from the P– region 1604 into the N+ region 1608. The result may be a net doping profile that is N+ throughout the transistor gates. Note that the oxide layer 1606 prevents diffusion in regions in which memory cells are being formed. Step 1522 is removal of the SiN hard mask that was used for forming the STI structures.

FIG. 18B depicts results after step 1522. FIG. 18B is similar to FIG. 16B. However, in this case there is no oxide layer 1606 in the transistor region. Moreover, what was a P– region 1604 in FIG. 18A is now transformed into an N+ region 1604' due to the diffusion.

Steps 1524-1540 are similar to corresponding steps in FIG. 15 and will not be discussed in detail. However, note that there is no counter-doping step in process 1700. Results after step 1540 may be similar to FIG. 9A.

There are many alternatives to the above described structures and processes within the spirit of embodiments. As in the existing NAND embodiments, an alternative is to fabricate the memory cells from PMOS devices with opposite polarity bias conditions for the various operations as compared to the existing NMOS implementation. In the above examples, the substrate is made of silicon. However, other materials known in the art can also be used such as Gallium Arsenide, etc.

One embodiment disclosed herein includes a non-volatile storage element, which may include: a channel region in a substrate, a tunnel oxide over the channel region, a floating gate, a control gate, and an inter-gate dielectric region between the floating gate and the control gate. The floating gate may have an interface to the tunnel oxide over the channel region. The floating gate may have a first region formed from P semiconductor and a second region formed from N semiconductor. The first region may substantially border the interface to the tunnel oxide over the channel region. The floating gate may have an interface to the inter-gate dielectric region. The second region may substantially border the interface between the floating gate and the inter-gate dielectric.

One embodiment disclosed herein includes a memory array comprising a plurality of non-volatile storage elements over a substrate. Each of the non-volatile storage elements may include a tunnel oxide over the substrate, a floating gate, a control gate, and an inter-gate dielectric region between the floating gate and the control gate. The floating gate may have an interface to the tunnel oxide. The floating gate may have a first region formed from P-semiconductor and a second region formed from N+ semiconductor. The first region of the floating gate may substantially border the interface between the floating gate and the tunnel oxide. The control gate may be over the second region of the floating gate. The second region of the floating gate may substantially border the interface between the floating gate and the inter-gate dielectric.

One embodiment disclosed herein includes a method for forming a memory array, which may include the following. An insulator may be formed over a substrate in one or more first regions for non-volatile storage elements and in one or more second regions for transistors. A P– semiconductor region may be formed over the insulator in the one or more first regions and in the one or more second regions. A first N+ semiconductor region may be formed over the P– semiconductor region in the one or more first regions and in the one or more second regions. The P– semiconductor region in the one or more second regions may be transformed into a second N+ semiconductor region. Floating gates for non-volatile storage elements may be formed in the one or more first regions from the P– semiconductor region and the first N+ semiconductor region that remains in the one or more first regions. Transistor gates may be formed in the one or more second regions; the transistor gates including at least the second N+ semiconductor region and the first N+ semiconductor region.

One embodiment disclosed herein includes a method for forming a non-volatile storage element, which may include the following. A tunnel oxide region may be formed over a substrate. A source/drain region may be formed in the substrate. A floating gate may be formed over the tunnel oxide between the source/drain regions. The floating gate may have an interface to the tunnel oxide between the source/drain regions. The floating gate may have a first region formed from P semiconductor and a second region formed from N semiconductor. The first region may substantially border the interface between the floating gate and the tunnel oxide between the source/drain regions. A control gate may be formed. An inter-gate dielectric region may be formed between the floating gate and the control gate. The floating gate may have an interface to the inter-gate dielectric region; the second region may substantially borders the interface to the inter-gate dielectric.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications, to thereby enable others skilled in the art to best utilize the various embodiments and with various modifications as are suited to the particular use contemplated. It is intended that the scope of embodiments be defined by the claims appended hereto.

What is claimed is:

1. A method for forming a memory array comprising:
forming insulator over a substrate, the insulator formed in one or more first regions for non-volatile storage elements and in one or more second regions for transistors;
forming a P− semiconductor region over the insulator in the one or more first regions and in the one or more second regions;
forming a first N+ semiconductor region over the P− semiconductor region in the one or more first regions and in the one or more second regions;
transforming the P− semiconductor region in the one or more second regions into a second N+ semiconductor region;
forming floating gates for non-volatile storage elements in the one or more first regions from the P− semiconductor region and the first N+ semiconductor region that remains in the one or more first regions; and
forming transistor gates in the one or more second regions, the transistor gates including portions of the second N+ semiconductor region and portions of the first N+ semiconductor region in the one or more second regions.

2. The method of claim 1, further comprising:
forming an inter-gate dielectric over the first N+ semiconductor region at least in the one or more first regions;
forming a third N+ semiconductor region over the inter-gate dielectric in the one or more first regions and in the one or more second regions; and
forming control gates for the non-volatile storage elements from portions of the third N+ semiconductor region.

3. The method of claim 2, wherein the forming transistor gates is performed after forming the third N+ semiconductor region, the transistor gates further including portions of the third N+ semiconductor region.

4. The method of claim 1, wherein the transforming the P− semiconductor region in the one or more second regions includes:
counter-doping the P− semiconductor region in the one or more second regions with an N-type impurity to form the second N+ semiconductor region, the second N+ semiconductor region borders the insulator in the one or more second regions.

5. The method of claim 4, further comprising:
forming a barrier region over the P− semiconductor region in the one or more first regions, the barrier region impedes diffusion of impurities between the first N+ semiconductor region and the P− semiconductor region.

6. The method of claim 5, further comprising:
forming the barrier region over the P− semiconductor region in the one or more second regions, the counter-doping includes implanting the N-type impurity through the barrier region in the one or more second regions.

7. The method of claim 1, further comprising:
forming an intrinsic semiconductor region over the P− semiconductor region in the one or more first regions, the first N+ semiconductor region is formed over the intrinsic semiconductor region.

8. The method of claim 1, wherein the transforming the P− semiconductor region in the one or more second regions includes:
performing a thermal anneal to cause diffusion of N-type impurities from the first N+ semiconductor region into the P− semiconductor region in the one or more second regions.

9. The method of claim 8, further comprising:
forming a barrier region over the P− semiconductor region in the one or more first regions, the barrier region prevents diffusion of impurities between the first N-type semiconductor region and the P− semiconductor region in the one or more first regions.

10. The method of claim 1, wherein the transistor gates include gates of select transistors in the memory array.

11. The method of claim 1, wherein the transistor gates include gates of transistors in a peripheral region of the memory array.

12. A method for forming a NAND string in a memory array, the method comprising:
forming insulator over a substrate, the insulator formed in a first region for non-volatile storage elements and in a second region for a select gate transistor;
forming a P− semiconductor region over the insulator in the first region and in the second region;
forming a first N+ semiconductor region over the P− semiconductor region in the first region and in the second region;
transforming the P− semiconductor region in the second region into a second N+ semiconductor region;
forming floating gates for the non-volatile storage elements in the first region from portions of the P− semiconductor region in the first region and portions of the first N+ semiconductor region in the first region; and
forming the select gate transistor in the second region from a portion of the second N+ semiconductor region and a portion of the first N+ semiconductor region in the second region.

13. The method of claim 12, further comprising:
forming an inter-gate dielectric over the first N+ semiconductor region the first region;
forming a third N+ semiconductor region over the inter-gate dielectric in the first region and in the second region; and
forming control gates for the non-volatile storage elements from portions of the third N+ semiconductor region.

14. The method of claim 13, wherein the select gate transistor is formed after forming the third N+ semiconductor region, the select gate transistor further including a portion of the third N+ semiconductor region.

15. The method of claim 12, wherein the transforming the P− semiconductor region in the second region includes:
counter-doping the P− semiconductor region in the second region with an N-type impurity to form the second N+ semiconductor region, the second N+ semiconductor region borders the insulator in the second region.

16. The method of claim 15, further comprising:
forming a barrier region over the P− semiconductor region in the first region, the barrier region impedes diffusion of impurities between the first N+ semiconductor region and the P− semiconductor region.

17. The method of claim 16, further comprising:
forming the barrier region over the P− semiconductor region in the second region, the counter-doping includes implanting the N-type impurity through the barrier region in the second region.

18. The method of claim 12, further comprising:
forming an intrinsic semiconductor region over the P− semiconductor region in the first region, the first N+ semiconductor region is formed over the intrinsic semiconductor region.

19. The method of claim 12, wherein the transforming the P− semiconductor region in the second region includes:
performing a thermal anneal to cause diffusion of N-type impurities from the first N+ semiconductor region in the second region into the P− semiconductor region in the second region.

20. The method of claim 19, further comprising:
forming a barrier region over the P− semiconductor region in the first region, the barrier region prevents diffusion of impurities between the first N-type semiconductor region in the first region and the P− semiconductor region in the first region.

\* \* \* \* \*